(12) United States Patent
Chiang et al.

(10) Patent No.: US 11,610,983 B2
(45) Date of Patent: *Mar. 21, 2023

(54) EPITAXIAL FEATURES CONFINED BY DIELECTRIC FINS AND SPACERS

(71) Applicant: Taiwan Semiconductor Manufacturing Co., Ltd., Hsin-Chu (TW)

(72) Inventors: Kuo-Cheng Chiang, Hsinchu County (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 70 days.

This patent is subject to a terminal disclaimer.

(21) Appl. No.: 17/189,678

(22) Filed: Mar. 2, 2021

(65) Prior Publication Data

US 2021/0210618 A1 Jul. 8, 2021

Related U.S. Application Data

(60) Continuation of application No. 16/686,475, filed on Nov. 18, 2019, now Pat. No. 11,164,961, which is a
(Continued)

(51) Int. Cl.
*H01L 29/06* (2006.01)
*H01L 29/66* (2006.01)
(Continued)

(52) U.S. Cl.
CPC .......... *H01L 29/6681* (2013.01); *H01L 21/823821* (2013.01); *H01L 29/0653* (2013.01);
(Continued)

(58) Field of Classification Search
CPC ..... H01L 29/06; H01L 29/0653; H01L 29/08; H01L 29/0847; H01L 29/66;
(Continued)

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |

(Continued)

FOREIGN PATENT DOCUMENTS

| | | |
|---|---|---|
| CN | 103050533 A | 4/2013 |
| CN | 103915345 A | 7/2014 |

(Continued)

*Primary Examiner* — Fazli Erdem
(74) *Attorney, Agent, or Firm* — Haynes and Boone, LLP

(57) ABSTRACT

A semiconductor device includes a substrate, a dielectric isolation structure disposed on the substrate, a semiconductor fin disposed on the substrate and extending through the dielectric isolation structure, first and second dielectric fins disposed on the dielectric isolation structure and sandwiching the semiconductor fin, a dielectric block disposed on the substrate and interfacing with the first and second dielectric fins, and an epitaxial feature over the semiconductor fin. The epitaxial feature has a bottom portion laterally between the first and second dielectric fins.

20 Claims, 20 Drawing Sheets

Related U.S. Application Data continuation of application No. 16/201,743, filed on Nov. 27, 2018, now Pat. No. 10,937,895, which is a division of application No. 15/800,287, filed on Nov. 1, 2017, now Pat. No. 10,483,378.

(60) Provisional application No. 62/552,523, filed on Aug. 31, 2017.

(51) Int. Cl.
  *H01L 29/78* (2006.01)
  *H01L 29/08* (2006.01)
  *H01L 21/8238* (2006.01)

(52) U.S. Cl.
  CPC .... *H01L 29/0847* (2013.01); *H01L 29/66545* (2013.01); *H01L 29/66636* (2013.01); *H01L 29/66795* (2013.01); *H01L 29/785* (2013.01); *H01L 29/7851* (2013.01); *H01L 2029/7858* (2013.01)

(58) Field of Classification Search
  CPC ......... H01L 29/66545; H01L 29/66636; H01L 29/6681; H01L 29/78; H01L 29/785; H01L 29/7851
  USPC ........................................................ 257/401
  See application file for complete search history.

(56) References Cited

U.S. PATENT DOCUMENTS

| | | |
|---|---|---|
| 9,093,514 B2 | 7/2015 | Tsai et al. |
| 9,236,267 B2 | 1/2016 | De et al. |
| 9,245,805 B2 | 1/2016 | Yeh et al. |
| 9,455,331 B1 | 9/2016 | Cai et al. |
| 9,520,482 B1 | 12/2016 | Chang et al. |
| 9,576,814 B2 | 2/2017 | Wu et al. |
| 9,799,570 B1 | 10/2017 | Cheng |
| 11,164,961 B2 * | 11/2021 | Ching .................. H01L 29/785 |
| 2015/0357190 A1 | 12/2015 | Chien et al. |
| 2016/0005656 A1 | 1/2016 | Ching et al. |
| 2016/0049516 A1 | 2/2016 | Huang et al. |
| 2016/0104793 A1 | 4/2016 | Ching |
| 2016/0233298 A1 | 8/2016 | Webb et al. |
| 2016/0268434 A1 | 9/2016 | Ching et al. |
| 2017/0012042 A1 | 1/2017 | Cai et al. |
| 2017/0178960 A1 | 6/2017 | Basker et al. |
| 2017/0207126 A1 | 7/2017 | Ching et al. |
| 2019/0006486 A1 | 1/2019 | Ching et al. |
| 2019/0067417 A1 * | 2/2019 | Ching ............. H01L 21/823481 |
| 2019/0097021 A1 | 3/2019 | Ching et al. |

FOREIGN PATENT DOCUMENTS

| | | |
|---|---|---|
| CN | 104576645 A | 4/2015 |
| CN | 106505104 | 3/2017 |
| CN | 106711217 A | 5/2017 |
| KR | 20160098195 | 8/2016 |
| KR | 20170077753 | 7/2017 |
| TW | 201725615 | 7/2017 |

\* cited by examiner

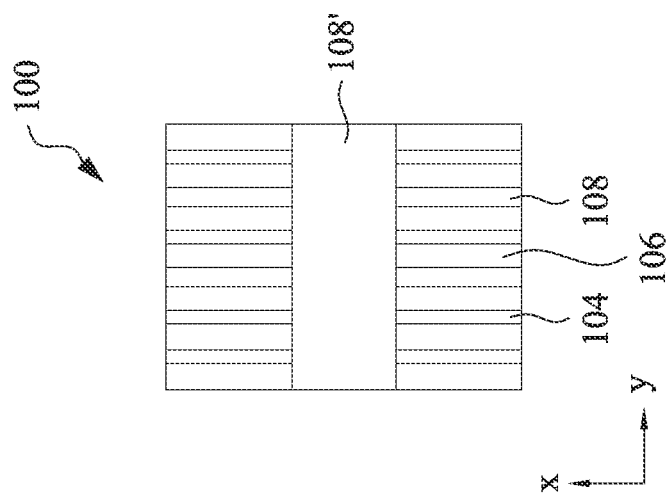
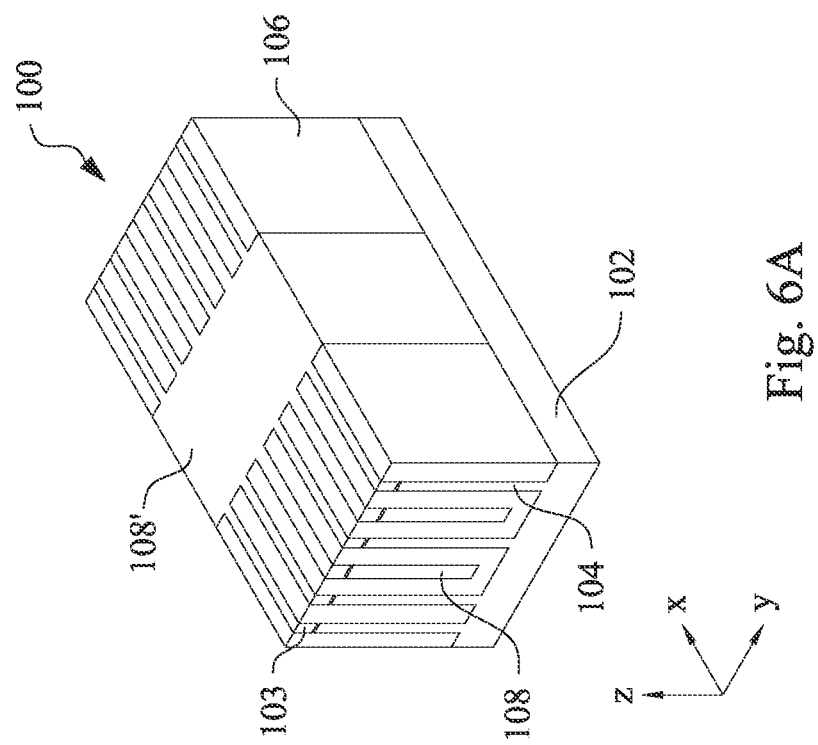
Fig. 6A
Fig. 6B

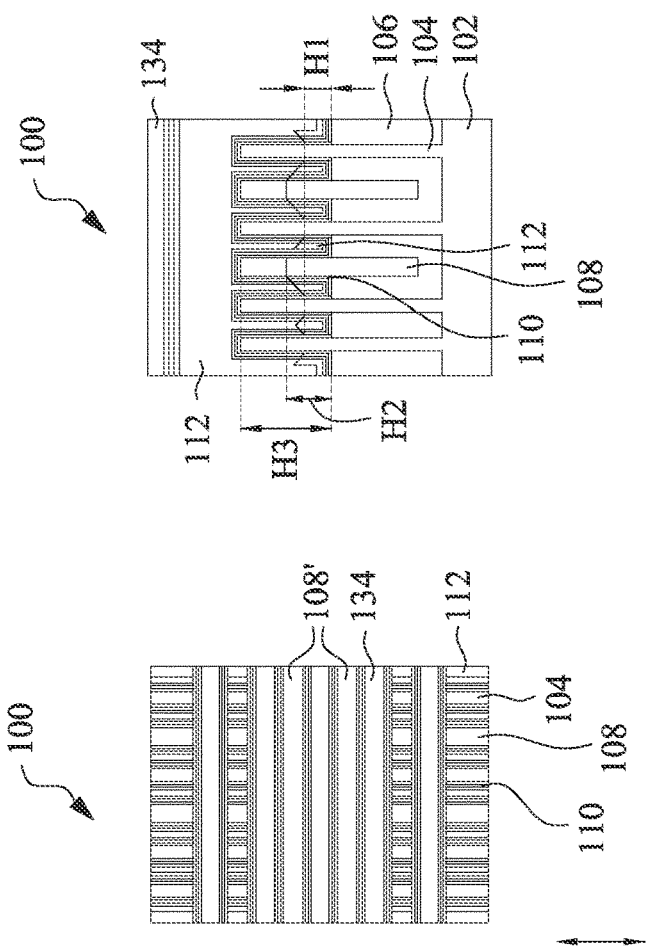
Fig. 14C
Fig. 14B
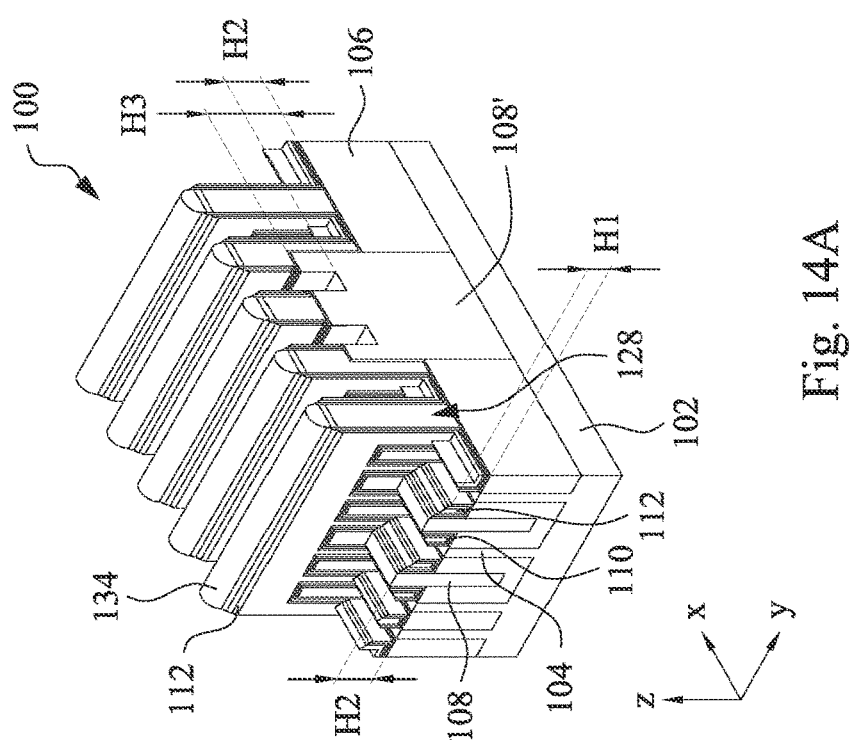
Fig. 14A

EPITAXIAL FEATURES CONFINED BY DIELECTRIC FINS AND SPACERS

PRIORITY

The present application is a continuation application of U.S. patent application Ser. No. 16/686,475, filed Nov. 18, 2019, which is a continuation application of U.S. patent application Ser. No. 16/201,743, filed Nov. 27, 2018, which is divisional application of U.S. patent application Ser. No. 15/800,287, filed Nov. 1, 2017, which claims priority to U.S. Prov. App. Ser. No. 62/552,523, filed Aug. 31, 2017, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in FINFET fabrication processes, it is typical to epitaxially grow some semiconductor materials over semiconductor fins as S/D features, referred to as EPI S/D features. Many technical efforts have been directed to the engineering of the size, shape, and material of these EPI S/D features. But, issues remain. One issue is related to spacing between EPI S/D features. When the spacing is large, cavities might be introduced at the bottom of an S/D contact that straddles over multiple EPI S/D features. This is caused by excessive etching into a dielectric material surrounding the EPI S/D features during the contact formation process. Another issue is related to the size of EPI S/D features. Large EPI S/D features typically increase the circuit's parasitic capacitance associated with source and drain terminals. Also, large EPI S/D features are more prone to patterning damages during S/D contact formation process. On the other hand, having small EPI S/D features typically increases the spacing among them, which might suffer the cavity issue discussed above.

Accordingly, improvements in the FINFET EPI S/D engineering are desirable.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A, 4A, 5A, 6A, 7, 8, 9A, 10A, 11, 12A, 13A, 14A, 15A, and 16 are perspective views of a portion of the semiconductor device in intermediate stages of fabrication according to an embodiment of the method in FIGS. 2A and 2B.

FIGS. 3B, 4B, 5B, 6B, 9B, 10B, 12B, 13B, 14B, and 15B are top views of a portion of the semiconductor device in intermediate stages of fabrication according to an embodiment of the method in FIGS. 2A and 2B.

FIGS. 9C, 10C, 14C, and 15C are side views of a portion of the semiconductor device in intermediate stages of fabrication according to an embodiment of the method in FIGS. 2A and 2B.

DETAILED DESCRIPTION

Figure 1A:
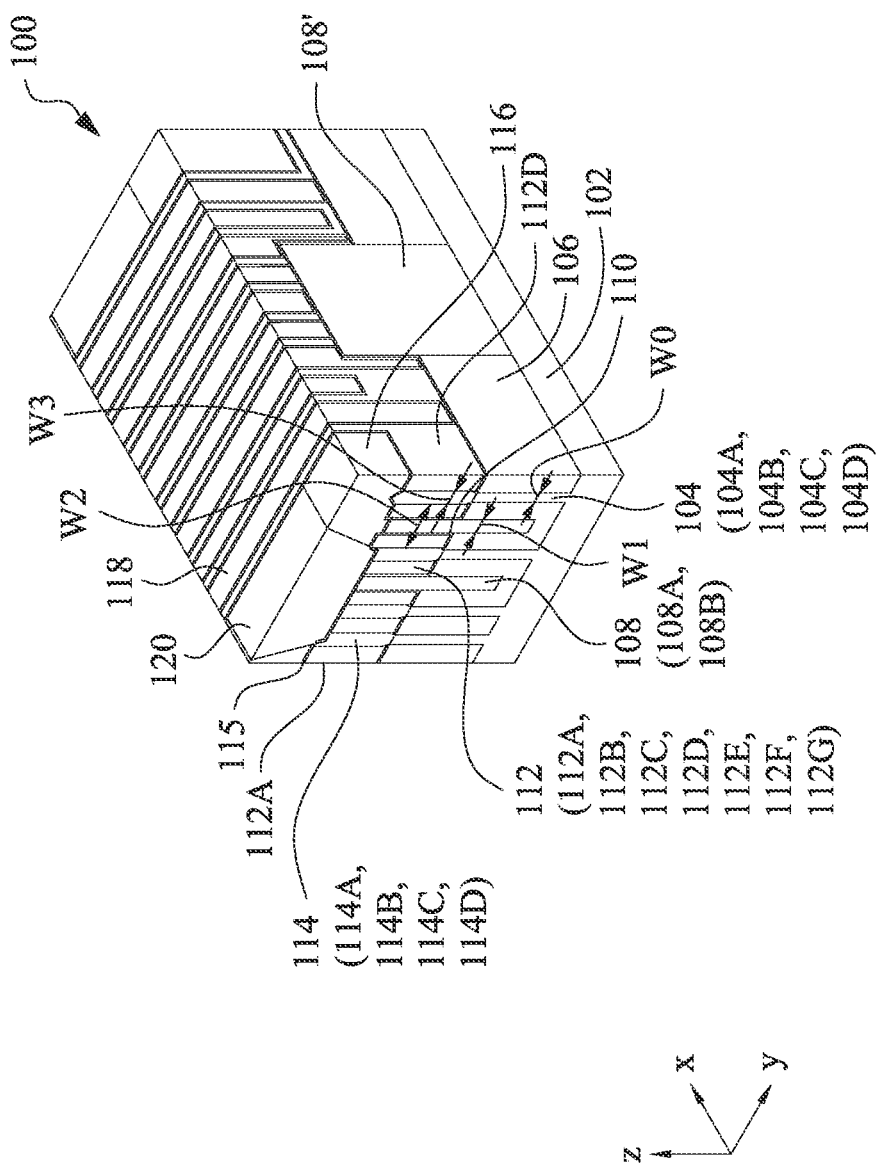
FIGS. 1A, 1B, 1C, 1D, and 1E are perspective views of a portion of a semiconductor device in intermediate stages of fabrication according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and methods of forming the same. More particularly, the present disclosure is related to FINFET source/drain (S/D) engineering. An object of the present disclosure is to limit the space for epitaxially growing S/D features, for example, by creating dielectric fins between semiconductor fins and creating dielectric spacer features around the dielectric fins and the semiconductor fins. As a result, the epitaxial S/D features are confined between the dielectric fins and dielectric spacer features. This can be used to produce any desirable size of the epitaxial S/D features, particularly small S/D features for reducing parasitic capacitances. Further, the dielectric fins and dielectric spacer features may include one or more dielectric materials that are different from typical interlayer dielectric (ILD)

layer, which prevents excessive etching of the dielectric materials between adjacent epitaxial S/D features during S/D contact formation process, thereby avoiding cavities under S/D contacts. These and other benefits of the present disclosure will be further explained by referring to the accompanied drawing figures.

FIG. 1A shows a perspective view of a portion of a semiconductor device 100 in an embodiment, according to aspects of the present disclosure. The device (or structure) 100 is provided for illustration purposes and does not necessarily limit the embodiments of the present disclosure to any number of transistors, any number of regions, or any configuration of structures or regions. Furthermore, the device 100 may be an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FINFETs and gate all-around (GAA) FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIG. 1A, the device 100 includes a substrate 102 and various structures (or features) built therein or thereon. Particularly, the device 100 includes semiconductor fins 104 protruding out of the substrate 102, an isolation structure 106 over the substrate 102 and between the semiconductor fins 104, and dielectric fins 108 partially embedded in the isolation structure 106 and projecting upwardly above the isolation structure 106. In the present embodiment, the device 100 further includes a dielectric block 108' which is formed of the same material and by the same process as the dielectric fins 108.

The device 100 further includes a thin oxide layer 110 and a spacer feature 112 over the oxide layer 110. In the present embodiment, the oxide layer 110 is disposed on top surfaces of the isolation structure 106 and sidewalls of the dielectric fins 108. The device 100 further includes epitaxial S/D features 114 over the semiconductor fins 104.

As shown in FIG. 1A, in the present embodiment, the device 100 includes four semiconductor fins 104, namely 104A, 104B, 104C, and 104D from left to right along the y direction. The spacing between the fins 104A and 104B is smaller than that between the fins 104B, 104C, and 104D. The device 100 includes four epitaxial S/D features 114, namely 114A, 114B, 114C, and 114D from left to right along the y direction, each atop one of the semiconductor fins 104A-D. The device 100 includes two dielectric fins 108, namely 108A and 108B from left to right along the y direction. The dielectric fin 108A is between the semiconductor fins 104B and 104C. The dielectric fin 108B is between the semiconductor fins 104C and 104D. The device 100 includes seven spacer features 112, namely 112A, 112B, 112C, 112D, 112E, 112F, and 112G from left to right along the y direction. Each of the epitaxial S/D features 114 is confined between and in physical contact with adjacent spacer features 112. The space between adjacent epitaxial S/D features 114 is completely filled by the dielectric fins 108, the oxide layer 110, and the spacer feature 112.

The device 100 further includes a contact etch stop layer (CESL) 115, an interlayer dielectric (ILD) layer 116 over the CESL 115, one or more gate stacks 118, and one or more S/D contact features 120. Particularly, some S/D contact feature 120 may straddle over multiple epitaxial S/D features 114 without any cavity thereunder. This is advantageous over some existing devices where the ILD layer 116 (instead of the dielectric fins 108 and the spacer feature 112) fills the space between adjacent epitaxial S/D features 114. In those devices, contact hole etching might create deep trenches into the ILD layer. Due to the limitation of metal filling, some cavities under the S/D contact features might ensue. These cavities might lead to long-term reliability issues in the circuit. The device 100 according to the present disclosure overcomes the above issues. The various components of the device 100 are further described below.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as having a buried dielectric layer.

The semiconductor fins 104 may include one or more semiconductor materials such as silicon, germanium, or silicon germanium. In an embodiment, each of the semiconductor fins 104 may include multiple different semiconductor layers stacked one over the other. The semiconductor fins 104 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 104 by etching initial epitaxial semiconductor layers of the substrate 102. The etching process can include dry etching, wet etching, reactive ion etching (RIE), and/or other suitable processes. In some embodiments, the fins 104 have a width W0 that ranges from about 9 nanometers (nm) to about 14 nm.

The isolation structure 106 may include silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structure 106 is formed by etching trenches in the substrate 102, e.g., as part of the fins 104 formation process. The trenches may then be filled with isolating material, followed by a chemical mechanical planarization (CMP) process and/or an etch-back process. Other isolation structure such as field oxide, LOCal Oxidation of Silicon (LOCOS), and/or other suitable structures are possible. The isolation structure 106 may include a multi-layer structure, for example, having one or more thermal oxide liner layers.

The dielectric fins 108 and the dielectric block 108' may include a dielectric material different from the isolation structure 106. For example, the dielectric fins 108 may include silicon carbide nitride (SiCN), silicon oxycarbide nitride (SiOCN), or silicon oxycarbide (SiOC) in some embodiments. Alternatively or additionally, the dielectric fins 108 may include a metal oxide such as hafnium oxide ($HfO_2$) or zirconium oxide ($ZrO_2$). The dielectric fins 108 and the dielectric block 108' may be deposited using chemical vapor deposition (CVD) or other suitable methods. In some embodiments, the dielectric fins 108 may have a width W1 (measured along the y direction) that ranges from about 9 nm to about 14 nm. The dielectric fins 108 help improve the density uniformity of the fins including the semiconductor fins 104 and the dielectric fins 108. Sometimes, the dielectric fins 108 are also referred to as dummy fins.

The oxide layer 110 may include silicon oxide ($SiO_2$), silicon oxynitride (SiON), aluminum silicon oxide (AlSiO), or other suitable oxide material; and may be deposited by chemical oxidation, thermal oxidation, atomic layer deposition (ALD), or other suitable methods.

The spacer feature 112 may include one or more dielectric layers having silicon nitride ($Si_3N_4$), silicon oxide ($SiO_2$), silicon carbide (SiC), silicon carbide nitride (SiCN), silicon oxynitride (SiON), silicon oxycarbide (SiOC), silicon oxycarbide nitride (SiOCN), a low-k dielectric material, other materials, or a combination thereof. The spacer feature 112 may be formed by one or more methods including chemical oxidation, thermal oxidation, ALD, CVD, and/or other suitable methods. In some embodiments, the combined layers of one dielectric fin 108 and the layers 110 and 112 on both sides of the dielectric fin 108 may have a width W2 (measured along the y direction) that ranges from about 19 nm to about 24 nm. In some embodiments, a ratio between W2 and W1 ranges from about 1.5 to about 2.5.

The epitaxial S/D features 114 may include epitaxially grown semiconductor material(s) such as epitaxially grown silicon for NFETs or epitaxially grown silicon germanium for PFETs, and may additionally include one or more p-type dopants, such as boron or indium, or one or more n-type dopants, such as phosphorus or arsenic. The epitaxial S/D features 114 may be formed by a low-pressure CVD (LPCVD) process with a silicon-based precursor, a selective epitaxial growth (SEG) process, a cyclic deposition and etching (CDE) process, or other epitaxial growth processes. In the present embodiment, the epitaxial S/D features 114 are in physical contact with the spacer features 112 and are confined in spaces between adjacent spacer features 112, thereby bearing a shape of substantially vertical bar. In some embodiments, the vertical bar has a width W3 (measured along the y direction) that ranges from about 10 nm to about 20 nm. In some embodiments, a ratio between W3 and W0 ranges from about 1.0 to about 1.5. The top portion of the S/D features 114 may be multi-faceted since it is no longer restricted by the spacer features 112. However, a majority of the S/D features 114 are sandwiched between the spacer features 112, and the multi-faceted top portion is only a small portion (less than 50%) of the S/D features 114 in terms of height. In an embodiment, the multi-faceted top portion is less than about 25% of the total height (along the Z direction) of the S/D features 114. In another embodiment, a width of the multi-faceted top portion is equal to or less than W3.

The contact etch stop layer (CESL) 115 may include silicon nitride, silicon oxynitride, silicon nitride with oxygen (O) or carbon (C) elements, and/or other materials. In one example, the CESL 115 includes silicon nitride (Si3N4) having an intrinsic stress with a magnitude of 1 GPa or higher. The intrinsic stress is compressive for p-channel devices and tensile for n-channel devices. The CESL 115 may be deposited using CVD, ALD, or other suitable methods.

The ILD layer 116 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 116 is disposed over the CESL 115 and may be formed by plasma enhanced CVD (PECVD), flowable CVD (FCVD), or other suitable methods.

Each gate stack 118 may include a gate dielectric layer, a work function metal layer, and a metal fill layer. The gate dielectric layer may include a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer may be formed by ALD and/or other suitable methods. The work function metal layer may be a p-type or an n-type work function layer. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The work function metal layer may include a plurality of layers and may be deposited by CVD, physical vapor deposition (PVD), and/or other suitable process. The metal fill layer may include aluminum (Al), tungsten (W), cobalt (Co), copper (Cu), and/or other suitable materials. The metal fill layer may be formed by CVD, PVD, plating, and/or other suitable processes.

The S/D contact features 120 may include tungsten (W), cobalt (Co), copper (Cu), other elemental metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. In an embodiment, the device 100 may further include a silicide feature (not shown) between the epitaxial S/D features 114 and the S/D contact features 120.

Figure 1B:
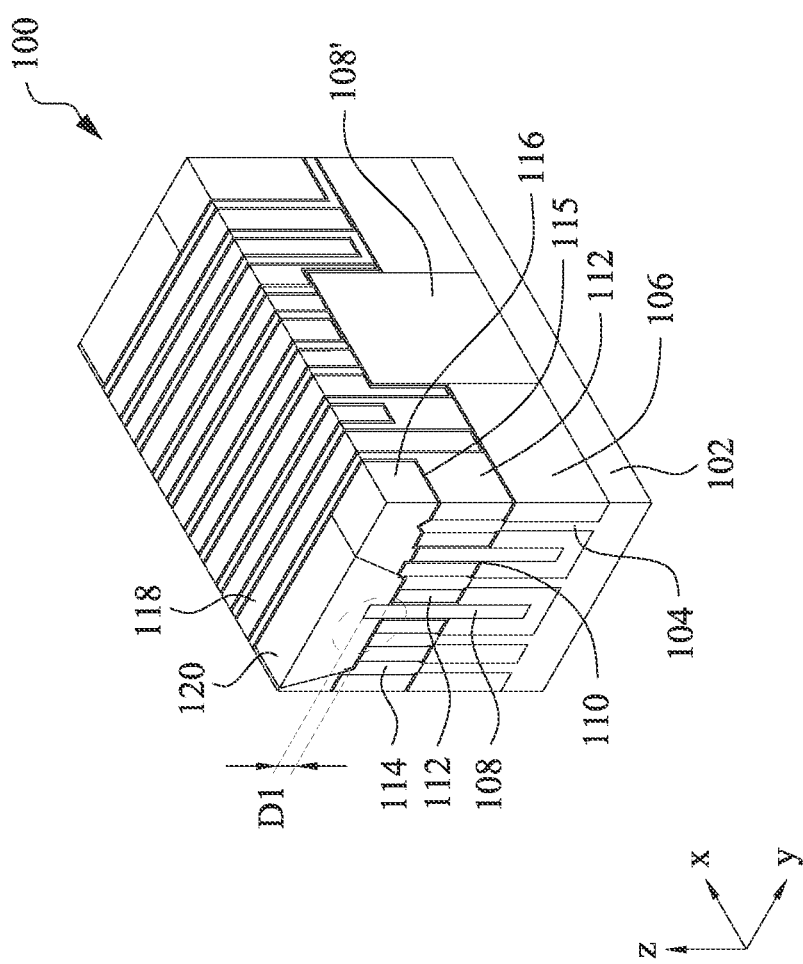

Referring to FIG. 1B, shown therein is a perspective view of a portion of the device 100, in accordance with another embodiment. In this embodiment, one or more dielectric fins 108 extend into the S/D contact features 120, as illustrated in the dashed circle in FIG. 1B. In other words, the S/D contact features 120 are disposed on top and sidewalls of the top portion of some dielectric fins 108. This may result from the dielectric fin 108's relatively high etch resistance to the etching process that is used to etch holes for the S/D contact 120. In some embodiments, this extension has a depth D1 (along the z direction) that ranges from about 3 nm to about 15 nm. Other aspects of this embodiment are the same as those of FIG. 1A, and are therefore omitted for the purpose of simplicity.

Figure 1C:
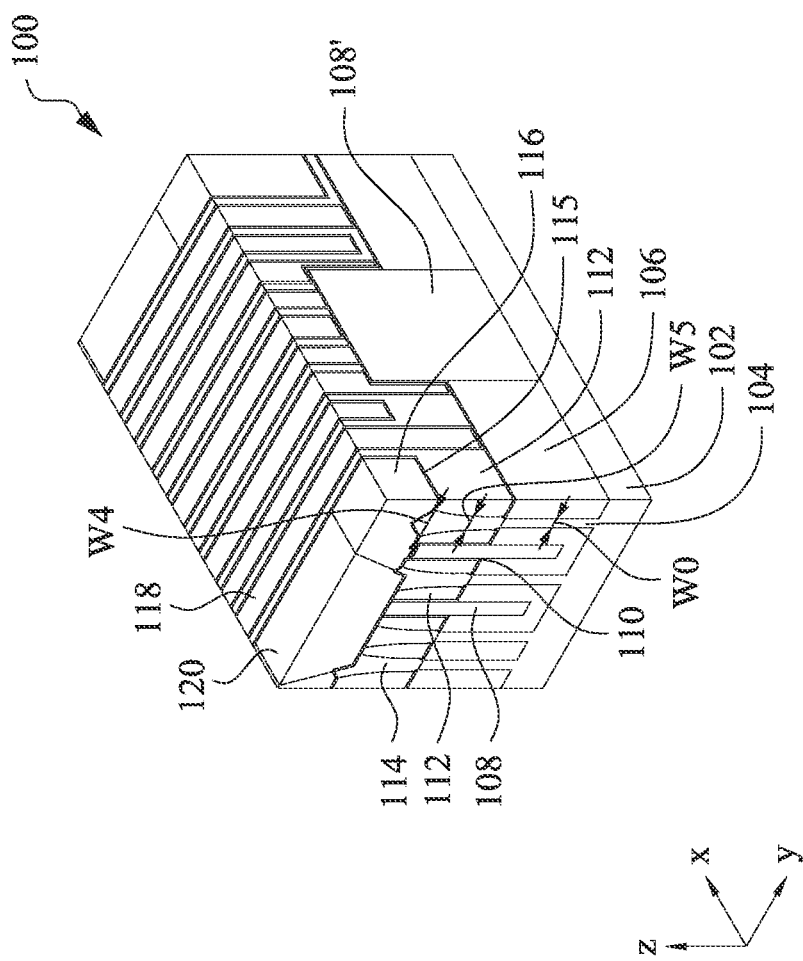

Referring to FIG. 1C, shown therein is a perspective view of a portion of the device 100, in accordance with yet another embodiment. In this embodiment, the S/D features 114 do not have a substantially vertical bar shape as those in FIG. 1A. Instead, the S/D features 114 in this embodiment are wider in their top portion than their middle and lower portions. The top portion has a width W4 as measured across top surfaces of the spacer features 112, the middle portion has a width W5 as measured at half-height of the S/D features 114, and W4 is greater than W5. The top portion is above the top surfaces of the spacer features 112 and therefore may be multi-facted. Remaining portions of the S/D features 114 are restricted between the spacer features 112. In some embodiments, W4 ranges from about 14 nm to about 30 nm, and W5 ranges from about 10 nm to about 20 nm. In some embodiments, a ratio between W4 and W5 ranges from about 1.2 to about 3.0, while a ratio between W5 and W0 ranges from about 1.0 to about 1.5. The top portion of the S/D features 114 may be less than 50% of the total height (along the Z direction) of the S/D feature 114 in an embodiment, such as less than about 25%. Other aspects of this embodiment are the same as those of FIG. 1A, and are therefore omitted for the purpose of simplicity.

Figure 1D:
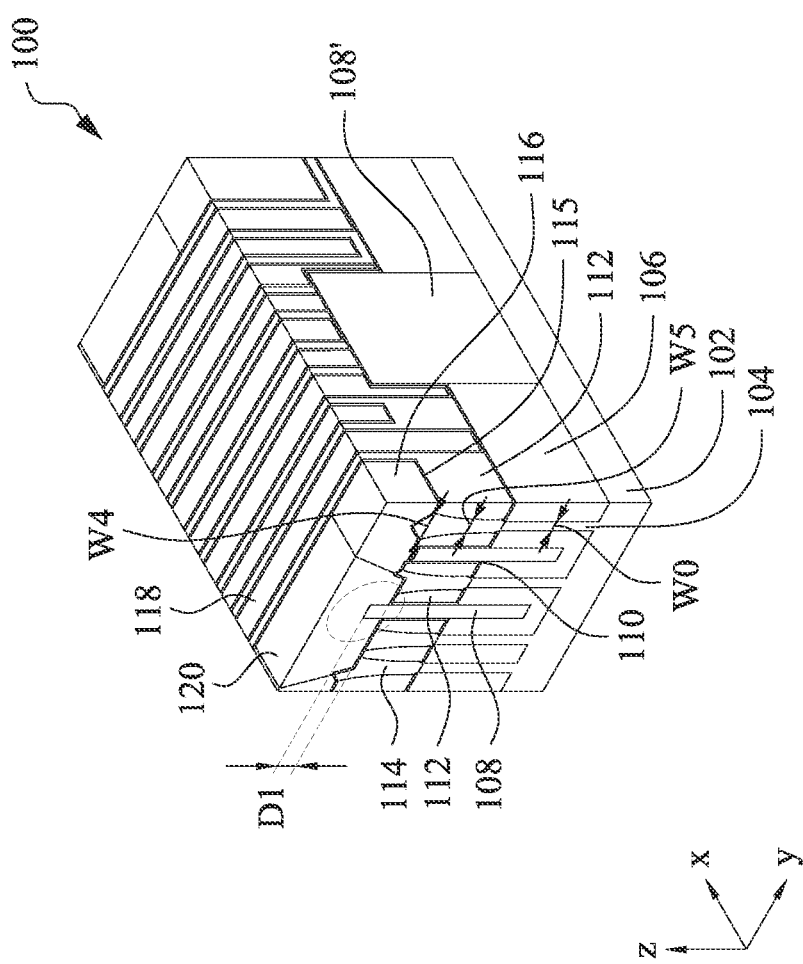

Referring to FIG. 1D, shown therein is a perspective view of a portion of the device 100, in accordance with yet another embodiment. This embodiment is similar to the one shown in FIG. 1C except that some dielectric fins 108 extend into the S/D contact features 120, as illustrated in the dashed circle in FIG. 1D. In other words, the S/D contact features 120 wrap around a top portion of those dielectric fins 108. In some embodiments, this extension has a depth D1 (along the z direction) that ranges from about 3 nm to about 15 nm. This may result from the dielectric fin 108's relatively high etch resistance to the etching process that is used to etch holes for the S/D contact 120. Other aspects of this embodiment are omitted for the purpose of simplicity.

Figure 1E:
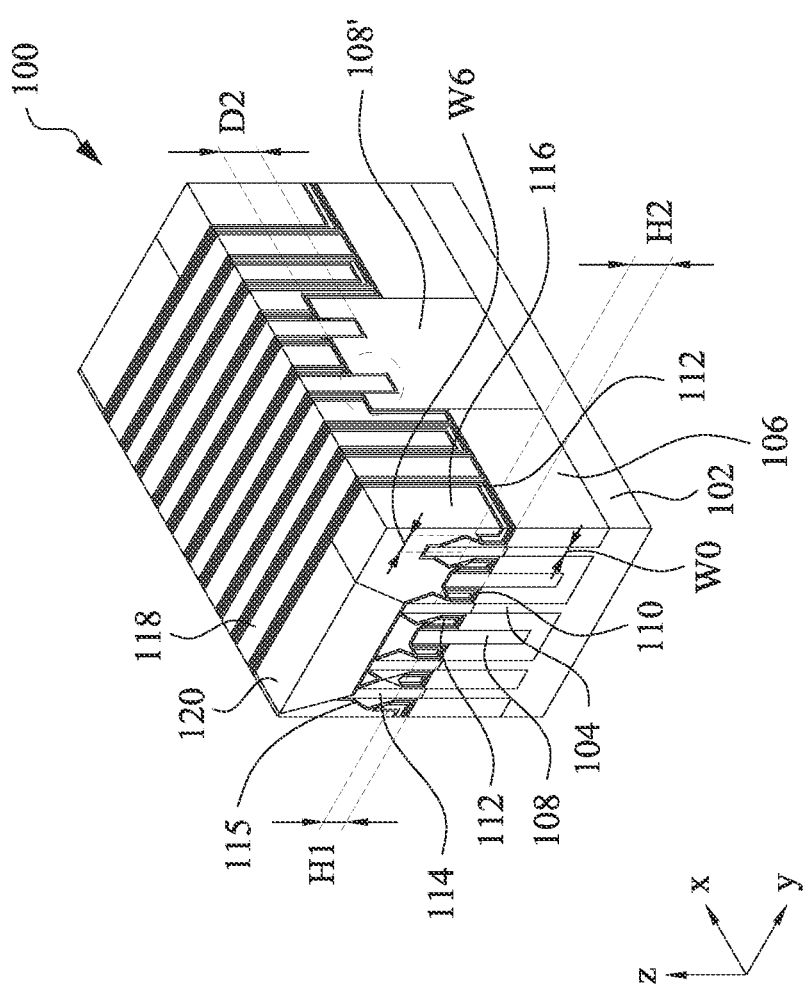

Referring to FIG. 1E, shown therein is a perspective view of a portion of the device 100, in accordance with another embodiment. In this embodiment, the dielectric fins 108 as well as the oxide layer 110 and the spacer features 112 on the sidewalls of the dielectric fins 108 are recessed prior to forming the epitaxial S/D features 114. In some embodiments, the dielectric fins 108 and portions of the dielectric block 108' are recessed by a depth D2 (along the z direction) that ranges from about 15 nm to about 40 nm. Due to this recess, the epitaxial S/D features 114 experience lateral growth above the dielectric layers 108, 110, and 112. In some embodiments, this lateral growth (along the y direction) has a width W6 may range from about 8 nm to about 15 nm as measured from the center of the epitaxial S/D feature 114 to the edge thereof. In some embodiments, a ratio between W6 and W0 ranges from about 0.9 to about 1.1. In some embodiments, the spacer features 112 on the sidewalls of the epitaxial S/D features 114 have a height H1 (along the z direction) that ranges from about 5 nm to about 20 nm, and the dielectric fins 108 have a height H2 (along the z direction) that is greater than H1 by about 5 nm to about 15 nm. In some embodiments, a ratio between H2 and H1 ranges from about 1.5 to about 4.0.

Figure 2A:
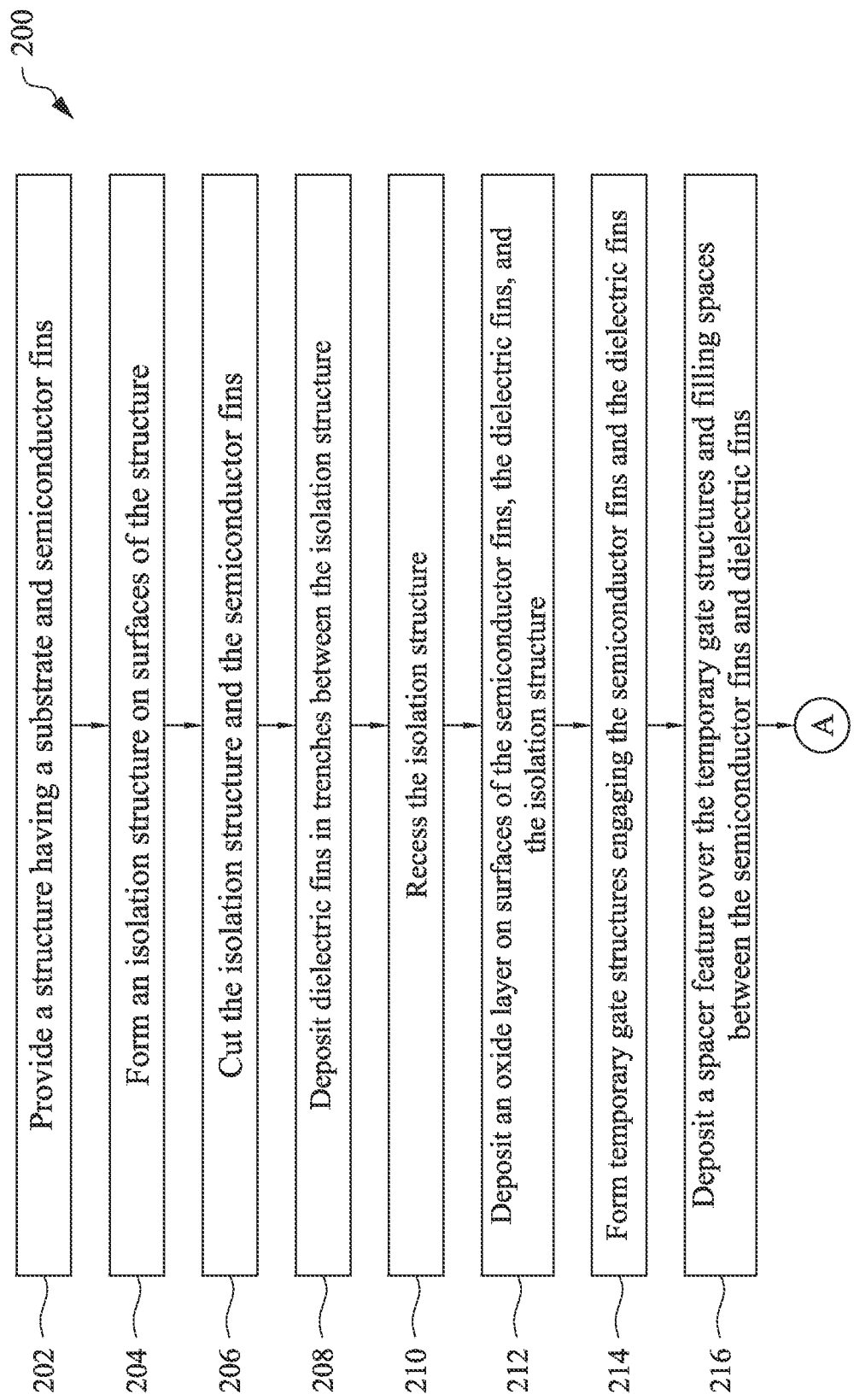
FIGS. 2A and 2B show a flow chart of a method of forming a semiconductor device according to various aspects of the present disclosure.
Figure 2B:
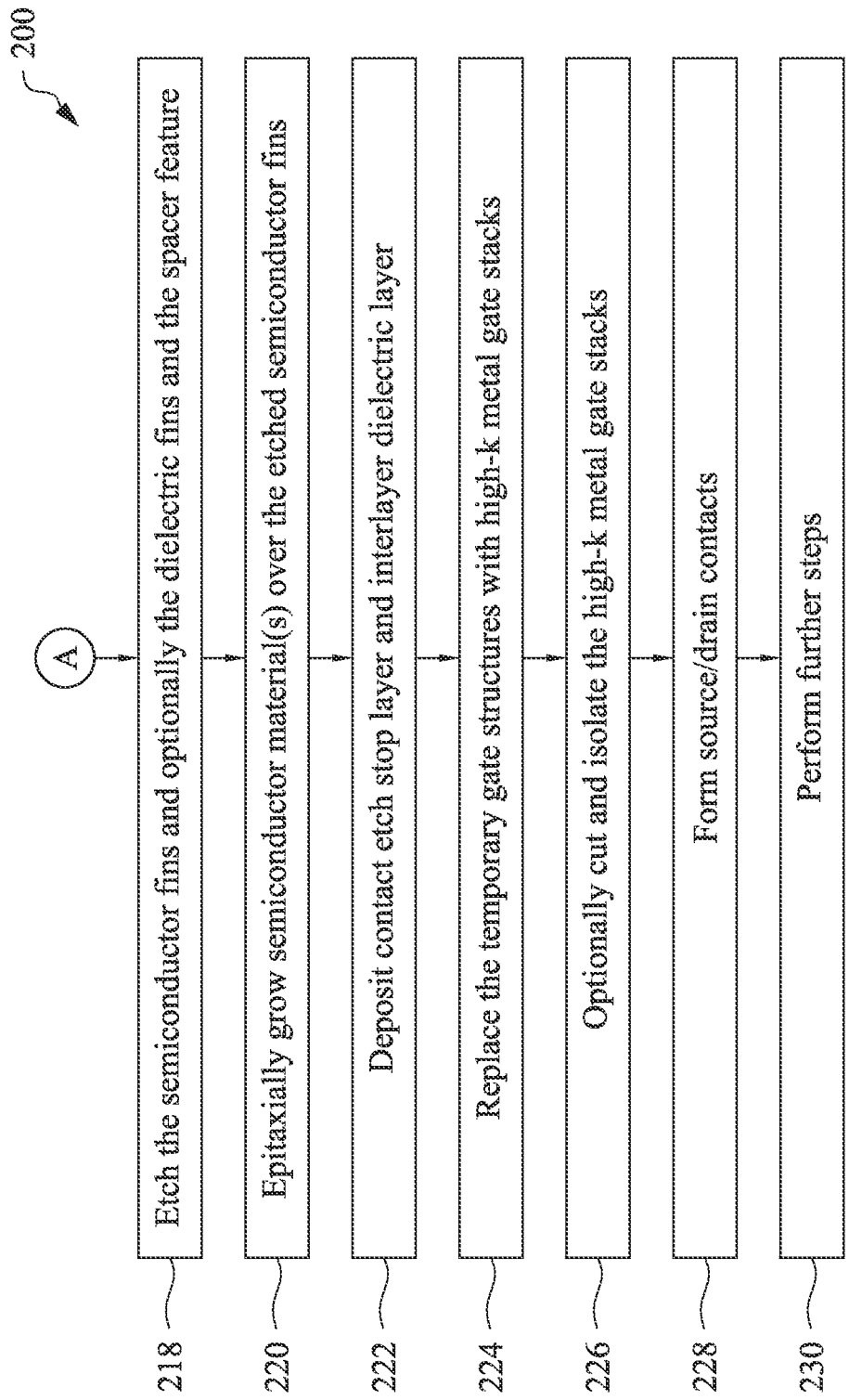

FIGS. 2A and 2B show a flow chart of a method 200 for forming the semiconductor device 100 in one or more embodiments, according to various aspects of the present disclosure. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3A-16. FIGS. 3A, 4A, 5A, 6A, 7, 8, 9A, 10A, 11, 12A, 13A, 14A, 15A, and 16 are perspective views, FIGS. 3B, 4B, 5B, 6B, 9B, 10B, 12B, 13B, 14B, and 15B are top views, and FIGS. 9C, 10C, 14C, and 15C are side views (along the x direction into the paper) of the semiconductor device 100 in intermediate stages of fabrication.

Figure 3B:
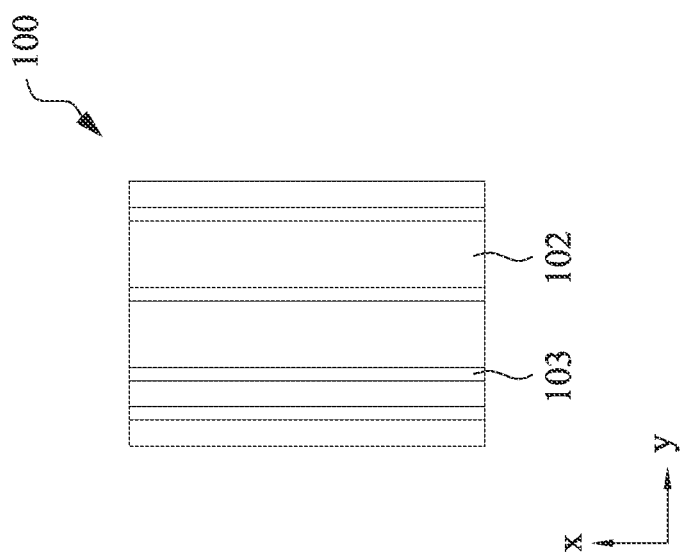
Figure 3A:
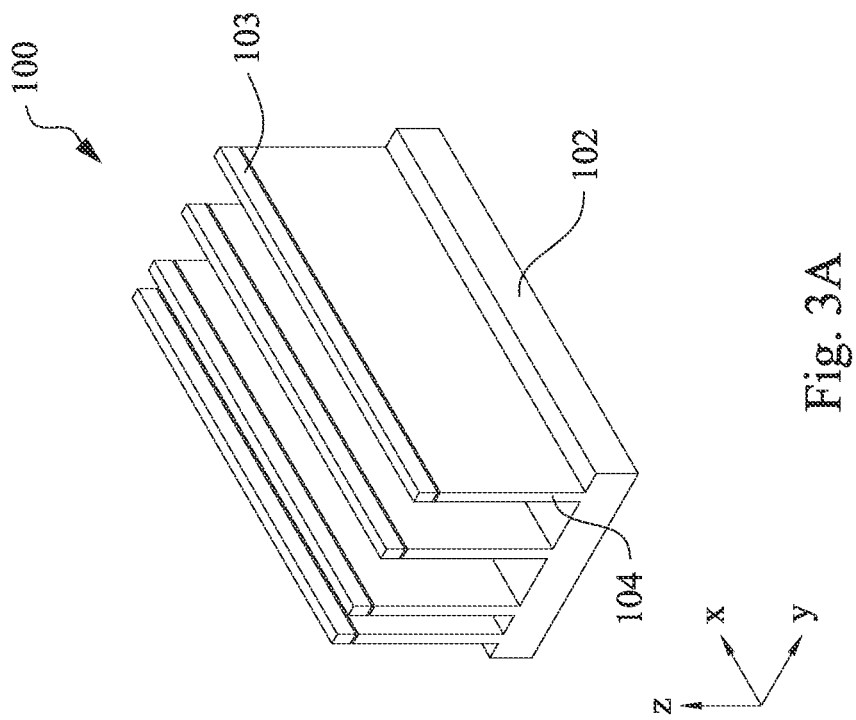

Referring to FIG. 2A, at operation 202, the method 200 provides (or is provided with) a structure (or device) 100 as shown in FIGS. 3A and 3B. The structure 100 includes the substrate 102 and semiconductor fins 104 extending from the substrate 102. The semiconductor fins 104 are arranged lengthwise along the x direction and may be spaced evenly or unevenly along the fin width direction (the y direction).

FIGS. 3A and 3B also illustrate a hard mask 103 that is used to pattern the semiconductor fins 104. In an embodiment, the operation 202 may epitaxially grow semiconductor materials over the entire surface of the substrate 102, and then etch the semiconductor materials using the hard mask 103 as an etch mask to produce the semiconductor fins 104. The materials for the substrate 102 and the semiconductor fins 104 have been disclosed above with reference to FIG. 1A. The hard mask 103 may include any suitable dielectric material such as silicon nitride. The hard mask 103 may be formed using suitable processes including double-patterning processes, multi-patterning processes, photolithography, self-aligned processes, and mandrel-spacer processes. The semiconductor materials can be etched with dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

Figure 4B:
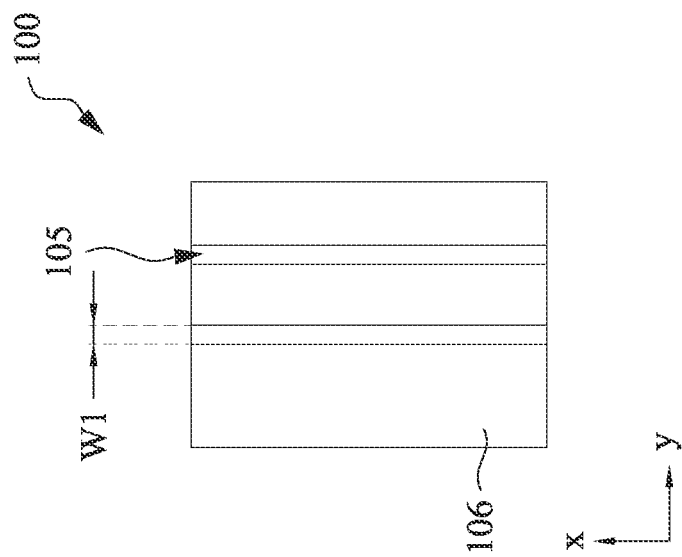
Figure 4A:
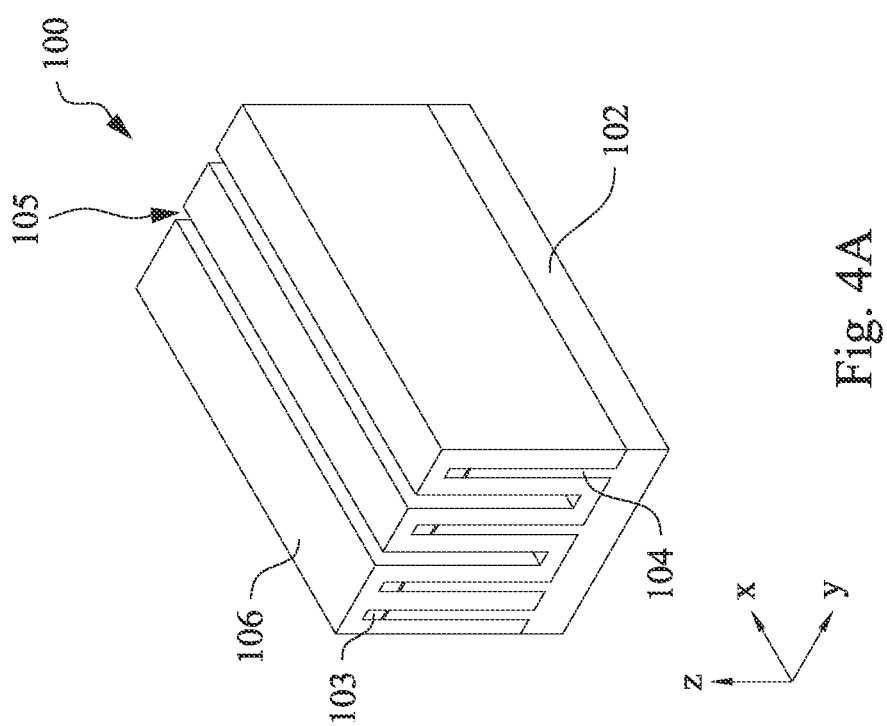

At operation 204, the method 200 (FIG. 2A) forms an isolation structure 106 on surfaces of the structure 100. Referring to FIGS. 4A and 4B, the isolation structure 106 is deposited over the top surface of the substrate 102 and over the top and sidewall surfaces of the semiconductor fins 104. In the present embodiment, the isolation structure 106 is deposited by an ALD method and its thickness (along the y direction) is controlled so as to provide dielectric trenches 105 between some adjacent semiconductor fins 104. The dielectric trenches 105 have a width W1, which ranges from about 9 nm to about 14 nm in some embodiments. The various dielectric trenches 105 may have the same or different widths in the same device 100. Further, the width W1 may be smaller than, equal to, or greater than the width of the semiconductor fins 104 in various embodiments. The dielectric trenches 105 will be filled with the dielectric fins 108 (e.g., FIG. 1A) in a later fabrication step. One design consideration is that, once filled in, the dielectric fins 108 will help improve the uniformity of the fins including the semiconductor fins 104 and the dielectric fins 108. This design consideration in conjunction with the width and pitch of the semiconductor fins 104 may be used for controlling the thickness of the isolation structure 106 during the deposition process.

Figure 5B:
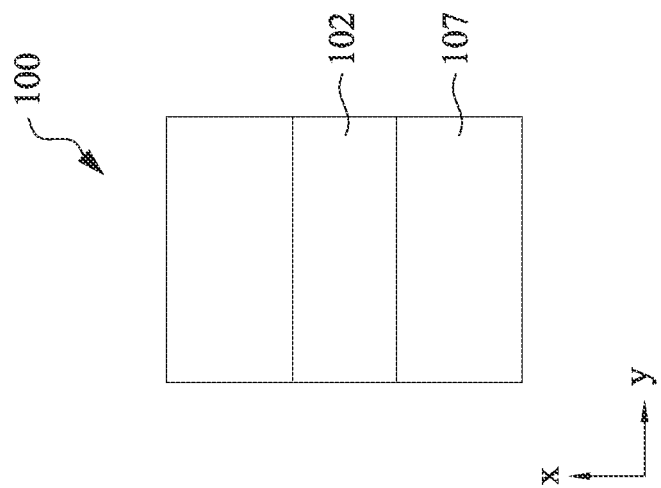
Figure 5A:
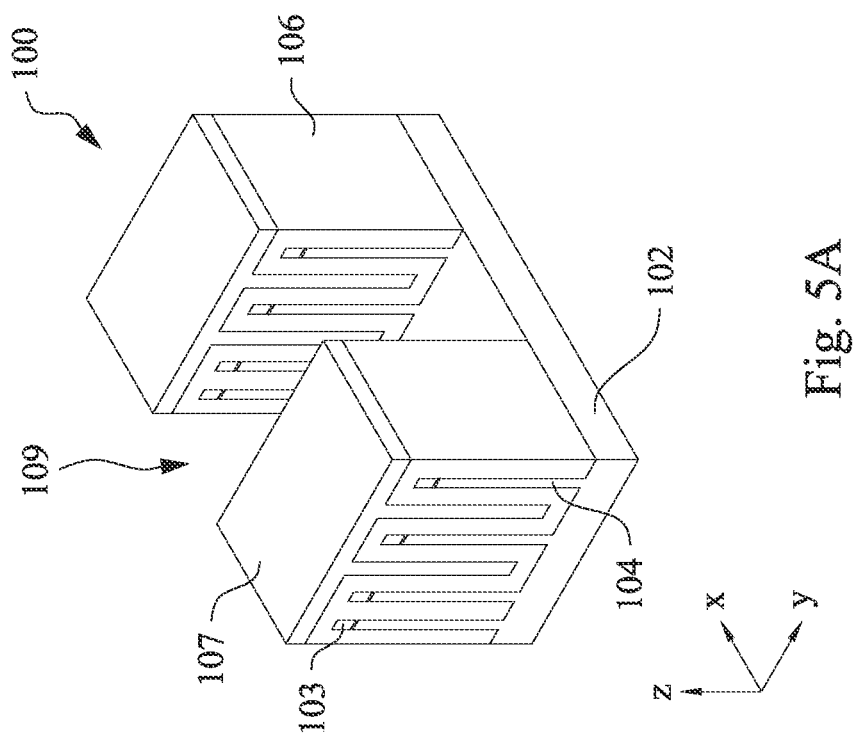

At operation 206, the method 200 (FIG. 2A) performs a cut process to separate the semiconductor fins 104 into multiple portions, each portion for forming an individual transistor. Referring to FIGS. 5A and 5B, the operation 206 forms a patterned mask 107 and etches the isolation structure 106 and the semiconductor fins 104 using the patterned mask 107 as an etch mask. In an embodiment, the patterned mask 107 is a patterned photoresist (or resist) formed by photoresist coating, exposing, post-exposure baking, and developing. In the present embodiment, the isolation structure 106 and the semiconductor fins 104 are etched until the substrate 102 is exposed, thereby forming a trench 109 over the substrate 102. In an alternative embodiment, some lower portion of the semiconductor fins 104 (also referred to as fin stub) may still exist within the trench 109. Subsequently, the patterned mask 107 is removed from the structure 100, for example, by a resist stripping or ashing process.

At operation 208, the method 200 (FIG. 2A) deposits one or more dielectric materials over the substrate 102 and the isolation structure 106, and filling the trenches 105 (FIG. 4A) and 109 (FIG. 5A). Subsequently, the operation 208 performs a chemical mechanical planarization (CMP) process to planarize the top surface of the structure 100 and to expose the hard mask 103. The resulting structure is shown in FIGS. 6A and 6B. The one or more dielectric materials may include silicon carbide nitride (SiCN), silicon oxycarbide nitride (SiOCN), silicon oxycarbide (SiOC), a metal oxide such as hafnium oxide ($HfO_2$) or zirconium oxide ($ZrO_2$), or a combination thereof; and may be deposited using CVD, PVD, or other suitable methods. The one or more dielectric materials in the trenches 105 (FIG. 4A) become the dielectric fins 108. The one or more dielectric materials in the trench 109 (FIG. 5A) become the dielectric block 108'. As illustrated in FIGS. 6A and 6B, the fins 104 and 108 are more uniformly distributed along the y direction than the fins 104 alone.

At operation 210, the method 200 (FIG. 2A) removes the hard mask 103 (e.g., silicon nitride), for example, by a wet etching process using $H_3PO_4$ or other suitable etchants. Thereafter, the method 200 recesses the isolation structure 106, for example, by a dry etching process or a wet etching process that is selective to the material of the isolation structure 106 and does not etch the semiconductor fins 104. In an embodiment, the operation 210 applies a Certas dry chemical etching process at 105 degrees Celsius to recess the isolation structure 106. The dielectric fins 108 are partially consumed during the operation 210. In a particular embodiment, the dielectric fins 108 are shortened to be at about the same height as the semiconductor fins 104. The operation 210 results in the semiconductor fins 104, the dielectric fins 108, and the dielectric block 108' extending above the top surface of the isolation structure 106.

Figure 7:
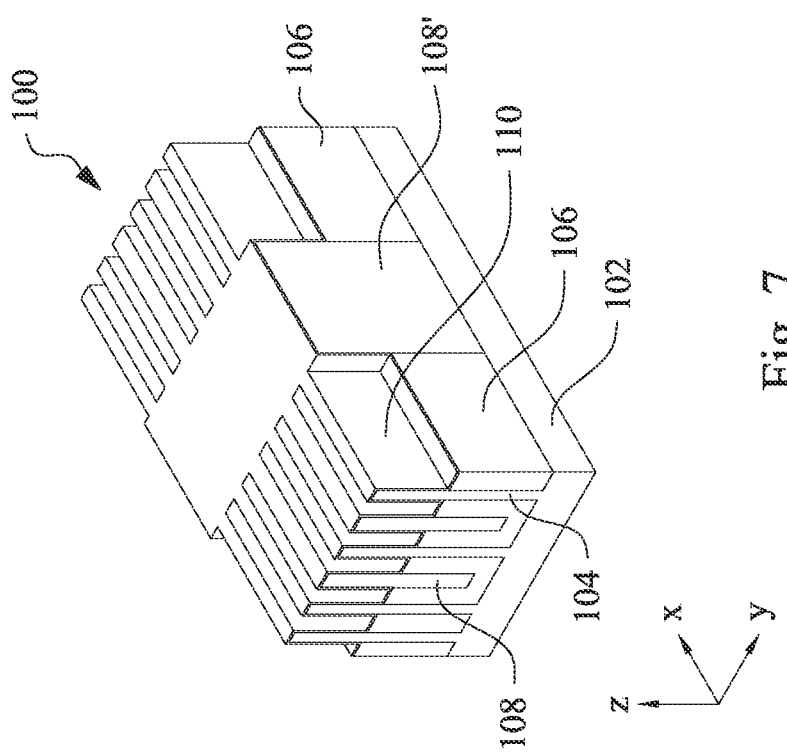

Subsequently, at operation 212, the method 200 (FIG. 2A) deposits an oxide layer 110, for example, by an ALD method over the various surfaces of the isolation structure 106, the semiconductor fins 104, the dielectric fins 108, and the dielectric block 108'. After the operations 210 and 212, the resulting structure 100 is shown in FIG. 7. The oxide layer 110 may include silicon oxide ($SiO_2$), silicon oxynitride (SiON), aluminum silicon oxide (AlSiO), or other suitable oxide material; and may be deposited by atomic layer deposition (ALD), or other suitable methods. In an alternative embodiment, the oxide layer 110 is deposited only on the surfaces of the semiconductor fins 104 and not on the surfaces of the layers 106 and 108, for example, by chemical oxidation.

Figure 8:
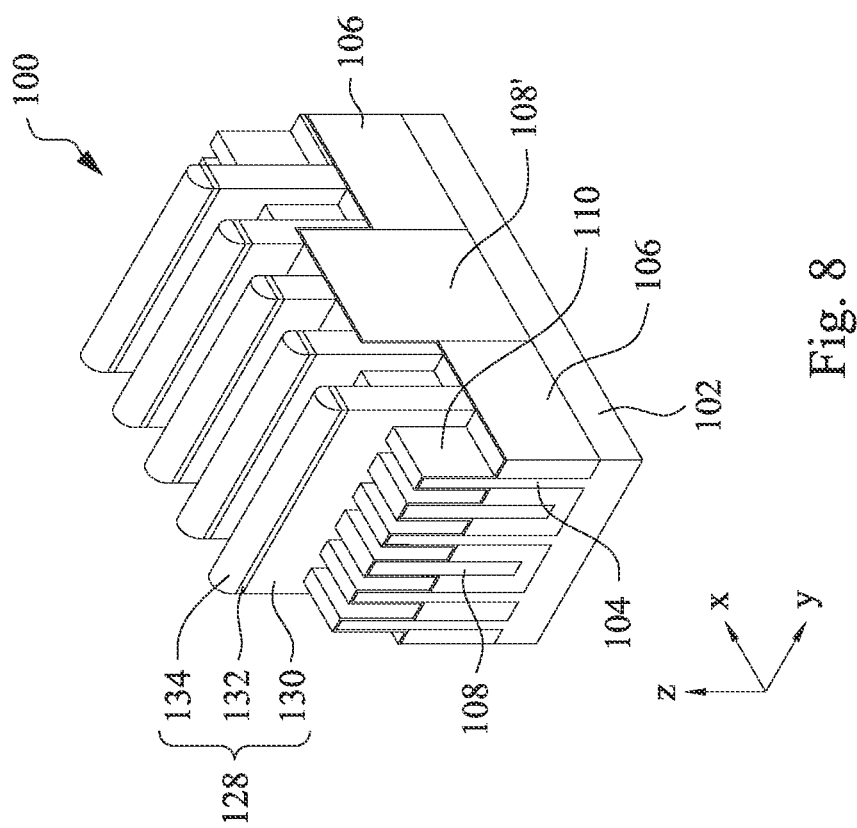

At operation 214, the method 200 (FIG. 2A) forms temporary gate structures 128 over the isolation structure 106, over the dielectric block 108', and engaging the semiconductor fins 104 and the dielectric fins 108 over top and sidewall surfaces thereof. Referring to FIG. 8, the temporary gate structures 128 include a gate electrode layer 130 and two hard mask layers 132 and 134 in the present embodiment. The temporary gate structures 128 will be replaced by the gate stacks 118 (e.g., FIG. 1A) in later fabrication steps. Therefore, they may also be referred to as dummy gates 128. The gate electrode 130 may include poly-crystalline silicon (poly-Si) and may be formed by suitable deposition processes such as LPCVD and PECVD. Each of the hard mask layers 132 and 134 may include one or more layers of dielectric material such as silicon oxide and/or silicon nitride, and may be formed by CVD or other suitable methods. The various layers 130, 132, and 134 may be patterned by photolithography and etching processes.

Figure 9C:
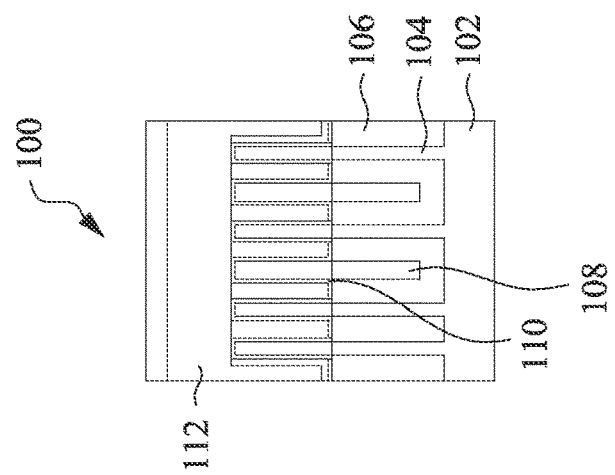
Figure 9B:
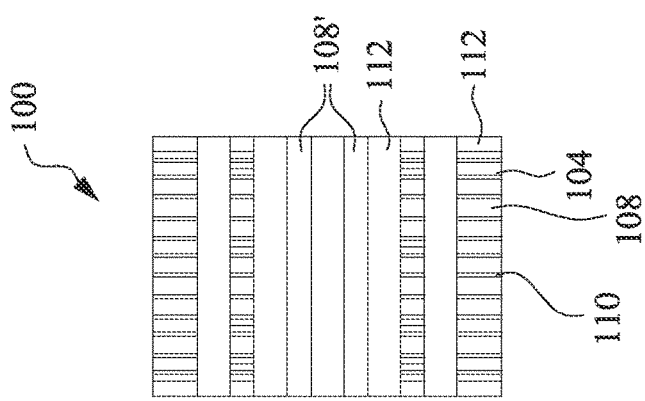

At operation 216, the method 200 (FIG. 2A) deposits a spacer feature 112 over the structure 100, on top and sidewalls of the temporary gate structures 128, and filling spaces between adjacent semiconductor fins 104 and dielectric fins 108. The operation 216 may subsequently perform an anisotropic etching process to remove the portion of the spacer feature 112 directly above the semiconductor fins 104 and the dielectric fins 108. As a result, top surfaces of the semiconductor fins 104, the dielectric fins 108, and the dielectric block 108' are exposed. The portion of the spacer feature 112 directly above the dummy gates 128 may or may not be completely removed by this anisotropic etching process. Subsequently, at operation 218, the method 200 (FIG. 2B) recesses the semiconductor fins 104 to a level at or below the top surface of the isolation structure 106. After the operations 216 and 218, the resulting structure 100 is shown in FIGS. 9A, 9B and 9C.

The spacer feature 112 may include one or more dielectric layers having silicon nitride ($Si_3N_4$), silicon oxide ($SiO_2$), silicon carbide (SiC), silicon carbide nitride (SiCN), silicon oxynitride (SiON), silicon oxycarbide (SiOC), silicon oxycarbide nitride (SiOCN), a low-k dielectric material, other materials, or a combination thereof. The spacer feature 112 may be deposited by one or more methods including ALD, CVD, and/or other suitable methods. Because the spaces between adjacent dummy gates 128 (along the x direction) are relatively large, the spacer feature 112 does not completely fill those spaces. However, the spaces between adjacent fins 104 and 108 are relatively small, and are completely filled by the spacer feature 112.

Figure 9A:
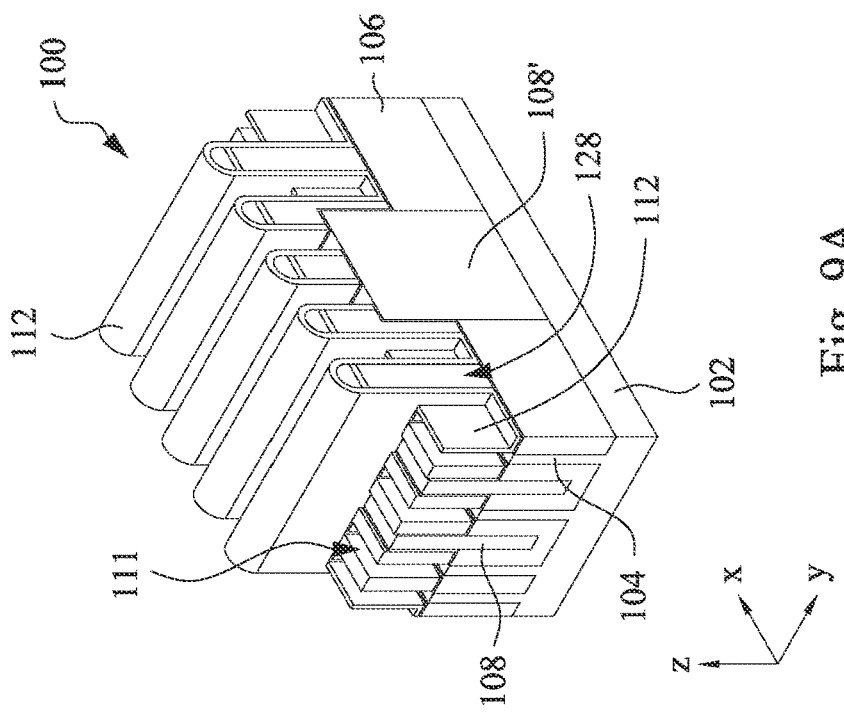

In an embodiment, the etching process in the operation 218 may be tuned to be selective to the semiconductor fins 104 and does not etch the dielectric fins 108 and the spacer feature 112, resulting in trenches 111 to have substantially vertical sidewalls, such as shown in FIG. 9A. This leads to the formation of the epitaxial S/D features 114 (e.g., FIGS. 1A, 1B, and 10) to have a substantially vertical bar shape. In the present embodiment, the oxide layer 110 on the sidewalls of the semiconductor fins 104 is also removed by this etching process. Therefore, the trenches 111 have spacer feature 112 as their sidewalls.

In another embodiment, the etching process in the operation 218 may also laterally etch the spacer feature 112 to result in the trenches 111 having their top opening wider than their respective bottom opening (not shown in FIG. 9A, but see FIGS. 1C and 1D). For example, the trenches 111 may have a top opening ranging from about 14 nm to about 30 nm and a bottom opening ranging from about 10 nm to about 20 nm in some embodiments. In some embodiments, a ratio between the top opening of each trench 111 and the bottom opening of the respective trench 111 ranges from about 1.2 to about 3.0. This leads to the formation of the epitaxial S/D features 114 (e.g., FIGS. 1C and 1D) to have their top portion wider than their respective bottom portion.

In yet another embodiment, the etching process in the operation 218 may also recess the dielectric fins 108 and the spacer feature 112, such as shown in FIG. 14A. As shown in FIG. 14A, portions of the dielectric block 108' are also recessed by the operation 218 in this embodiment. The portions of the dielectric fins 108 and the dielectric block 108' under the dummy gates 128 are not recessed by the operation 218 and have a height H3. Other portions of the dielectric fins 108 and the dielectric block 108' are recessed by the operation 218 and have a remaining height H2. In some embodiments, the height H3 is greater than the height H2 by about 15 nm to 40 nm, which represents the lost height of the dielectric fins 108 during the operation 218. In some embodiments, a ratio between H2 and H3 ranges from about 0.3 to about 0.7. Further, the spacer feature 112 is also recessed to have a remaining height H1 that ranges from about 5 nm to about 20 nm. In some embodiments, the height H2 is greater than the height H1 by about 5 nm to about 15 nm. This embodiment leads to the lateral growth of the epitaxial S/D features 114 (e.g., FIGS. 1E and 15A), and the heights H1 and H2 can be tuned for controlling the height, width, and lateral expansion of the epitaxial S/D features 114.

Figure 10C:
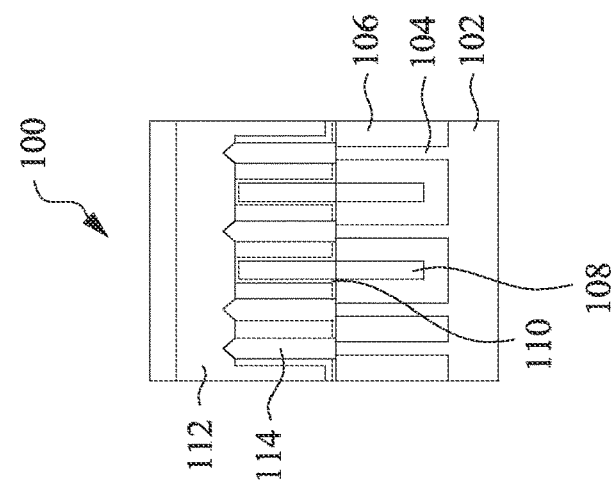
Figure 10B:
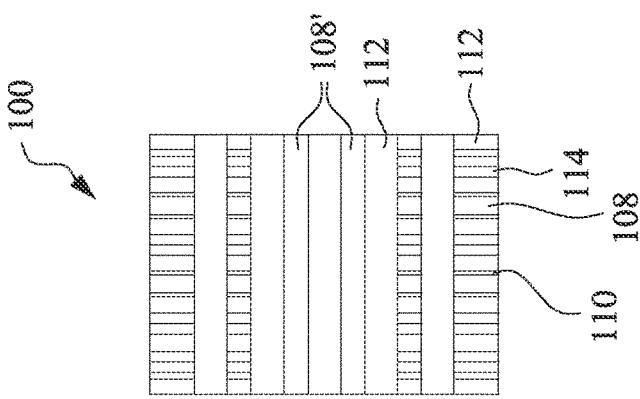
Figure 10A:
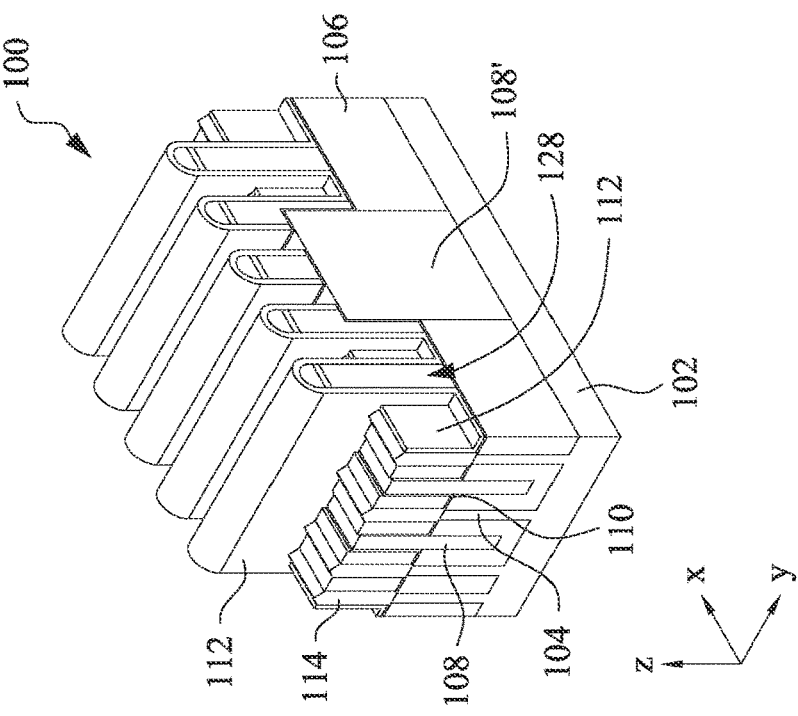
Figure 15C:
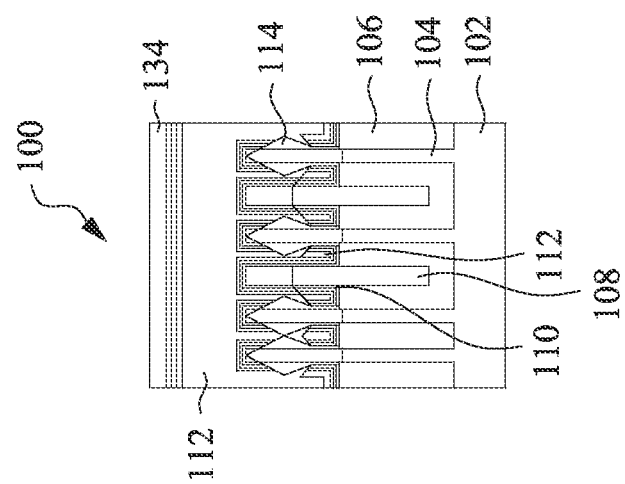
Figure 15B:
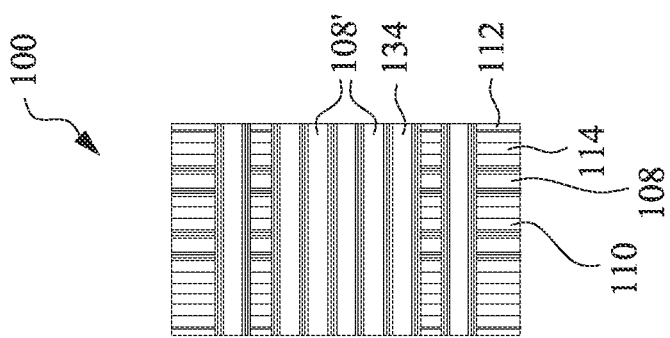
Figure 15A:
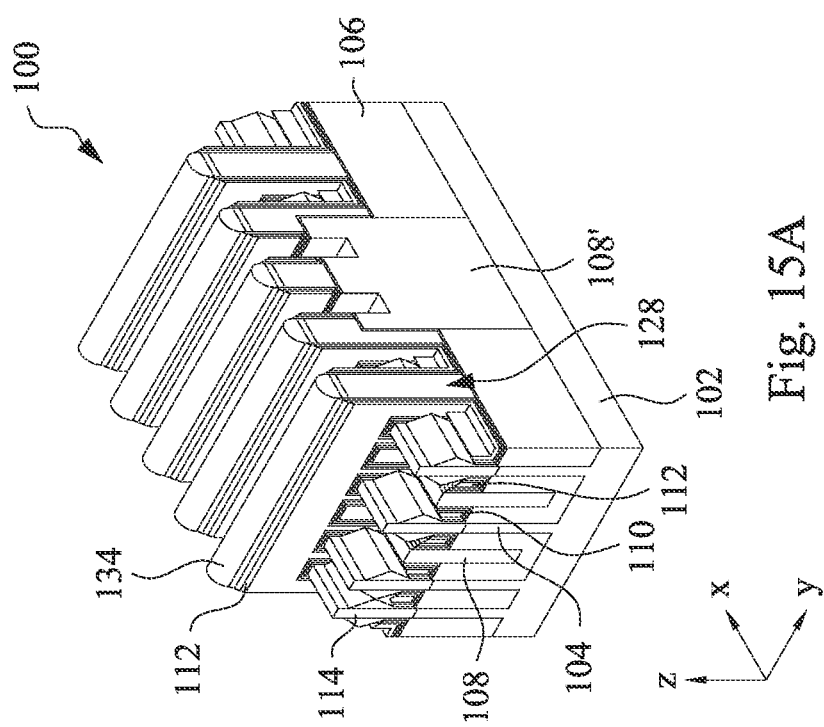

At operation 220, the method 200 (FIG. 2B) epitaxially grows one or more semiconductor materials 114 over the recessed semiconductor fins 104. The one or more semiconductor materials 114 are also referred to as the epitaxial S/D features 114. Depending on the etching process in operation 218, the epitaxial S/D features 114 may have different profiles such as shown in FIG. 10A and FIG. 15A. Referring to FIGS. 10A, 10B, and 10C, in this embodiment, the epitaxial S/D features 114 are shaped as substantially vertical bars, and their growth are substantially confined by the dielectric fins 108 and the spacer feature 112. These epitaxial S/D features 114 are relatively small in size and provide reduced parasitic capacitances. Referring to FIGS. 15A, 15B, and 15C, in this embodiment, the epitaxial S/D features 114 have a substantially vertical lower portion between the spacer features 112, and an expanded top portion above the dielectric fins 108 and the spacer feature 112. The heights of the dielectric fins 108 and the spacer feature 112 can be used for tuning the lateral expansion of the epitaxial S/D features 114, for example, whether or not to merge adjacent S/D features. The operation 220 may grow the features 114 using an LPCVD process, a selective epitaxial growth (SEG) process, a cyclic deposition and etching (CDE) process, or other epitaxial growth processes; and may dope the features 114 (in-situ or ex-situ) with one or more p-type dopants (e.g., boron or indium) for PFETs, or one or more n-type dopants (e.g., phosphorus or arsenic) for NFETs.

Figure 11:
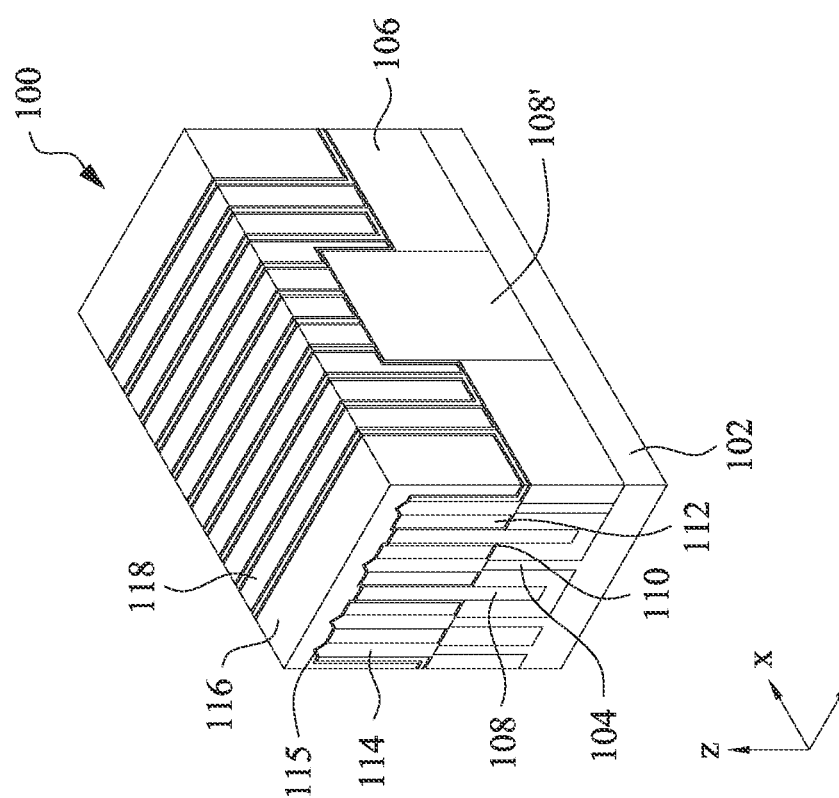
Figure 16:
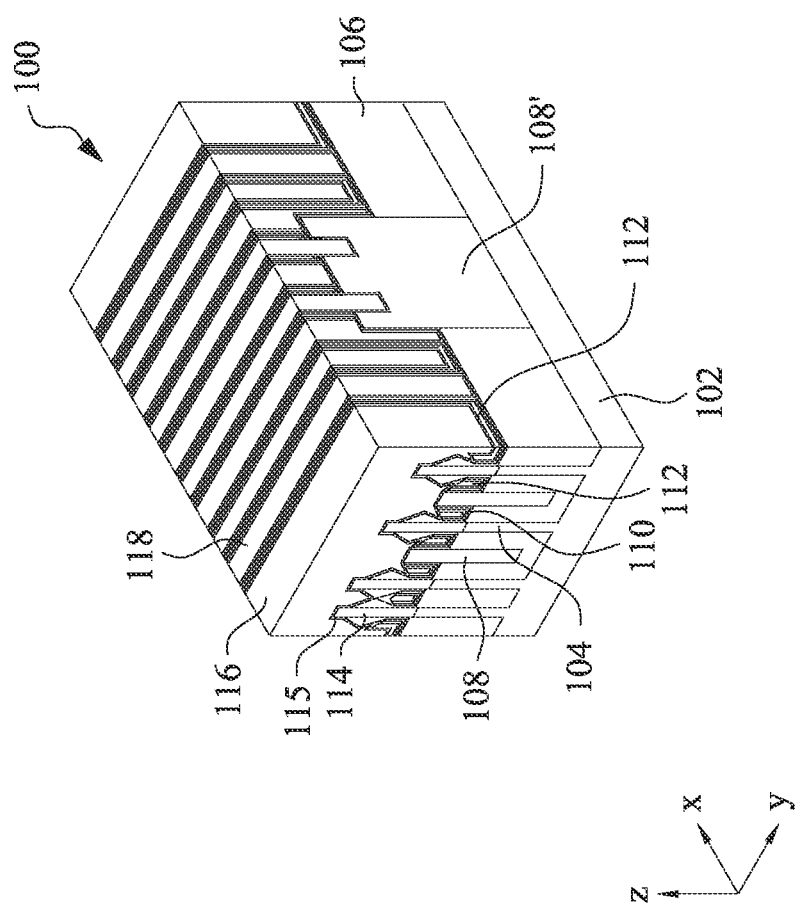

At operation 222, the method 200 (FIG. 2B) deposits a contact etch stop layer (CESL) 115 over the structure 100 and an interlayer dielectric (ILD) layer 116 over the CESL 115. FIGS. 11 and 16 show two alternative embodiments of the structure 100 following the embodiments shown in FIGS. 10A and 15A, respectively. Referring to FIGS. 11 and 16, the CESL 115 may include silicon nitride, silicon oxynitride, silicon nitride with oxygen (O) or carbon (C) elements, and/or other materials; and may be deposited using CVD, ALD, or other suitable methods. The ILD layer 116 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 116 may be deposited by PECVD, FCVD, or other suitable methods. After the ILD layer 116 is deposited, the operation 222 may perform one or more CMP processes to planarize the top surface of the structure 100 and to expose the dummy gates 128 (not shown in FIGS. 11 and 16).

At operation 224, the method 200 (FIG. 2B) replaces the dummy gates 128 (e.g., FIGS. 10A and 15A) with final gate stacks 118 (FIGS. 11 and 16). In an embodiment, the operation 224 applies one or more etching processes to remove the dummy gates 128. The etching processes may include dry etching, wet etching, reactive ion etching, or other suitable methods. The etching processes result in trenches between adjacent spacer features 112 that expose the semiconductor fins 104, the dielectric fins 108, and the dielectric block 108'. Subsequently, the operation 224 deposits the final gate stacks 118 into the trenches. Each gate stack 118 may include a gate dielectric layer, a work function metal layer, and a metal fill layer. The materials for the various layers have been discussed above with reference to FIG. 1A. The operation 224 may use CVD, ALD, PVD, plating, and/or other suitable methods for depositing the gate stacks 118.

Figure 12B:
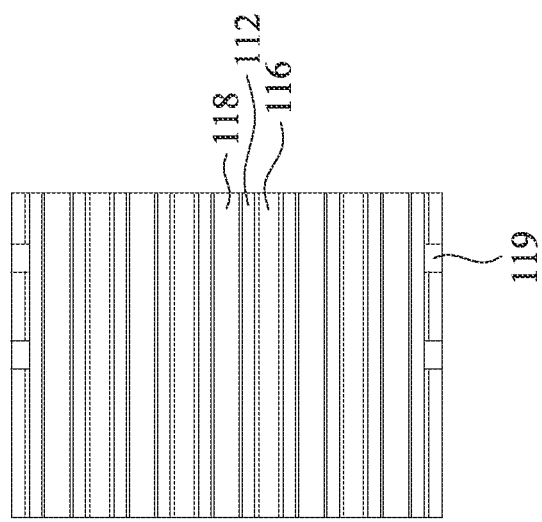
Figure 12A:
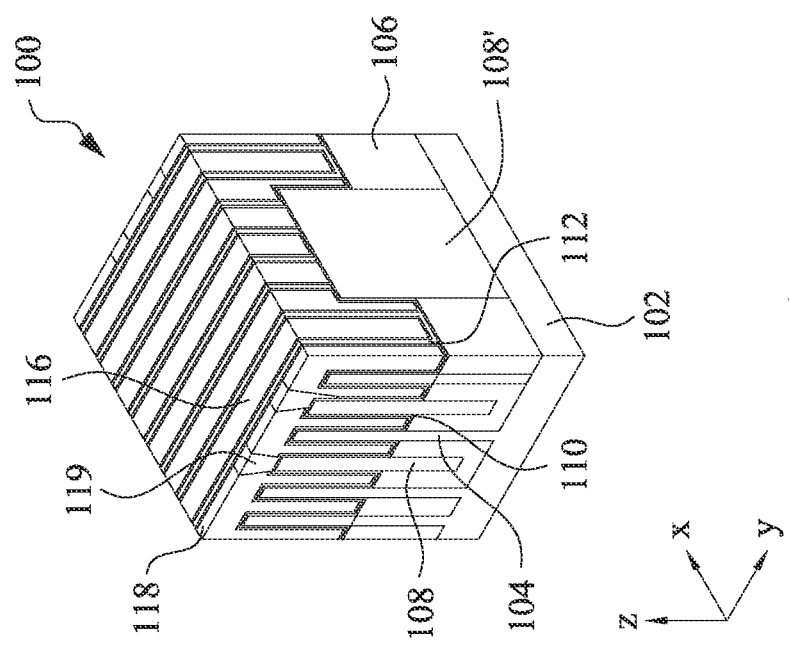

At operation 226, the method 200 (FIG. 2B) may optionally cut some gate stacks 118 to form separate gate terminals. An example is illustrated in FIGS. 12A and 12B. Referring to FIGS. 12A and 12B, a gate stack 118 is etched into three portions and a dielectric material 119 is deposited between the three portions to thereby form three gate terminals that are lengthwise aligned along the y direction. In the present embodiment, the cut positions are generally aligned with the dielectric fins 108. Therefore, the dielectric material 119 and the dielectric fins 108 collectively isolate the three portions of the gate stack 118. The operation 226 may apply one or more etching processes such as wet etching, dry etching, and/or reactive ion etching to etch the gate stacks 118. Further, the dielectric material 119 may include silicon nitride or other suitable dielectric material, and may be deposited using ALD, CVD, or other suitable methods.

Figure 13B:
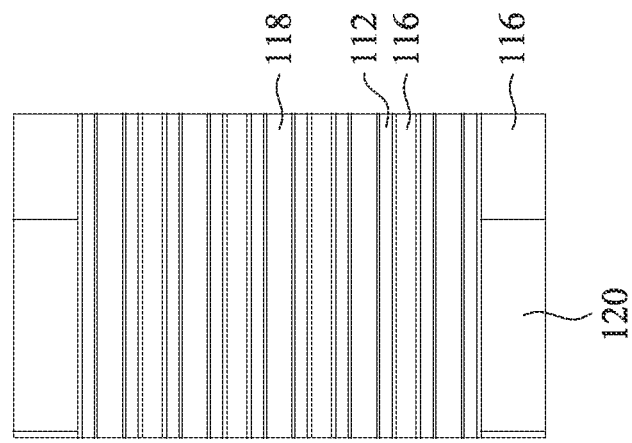
Figure 13A:
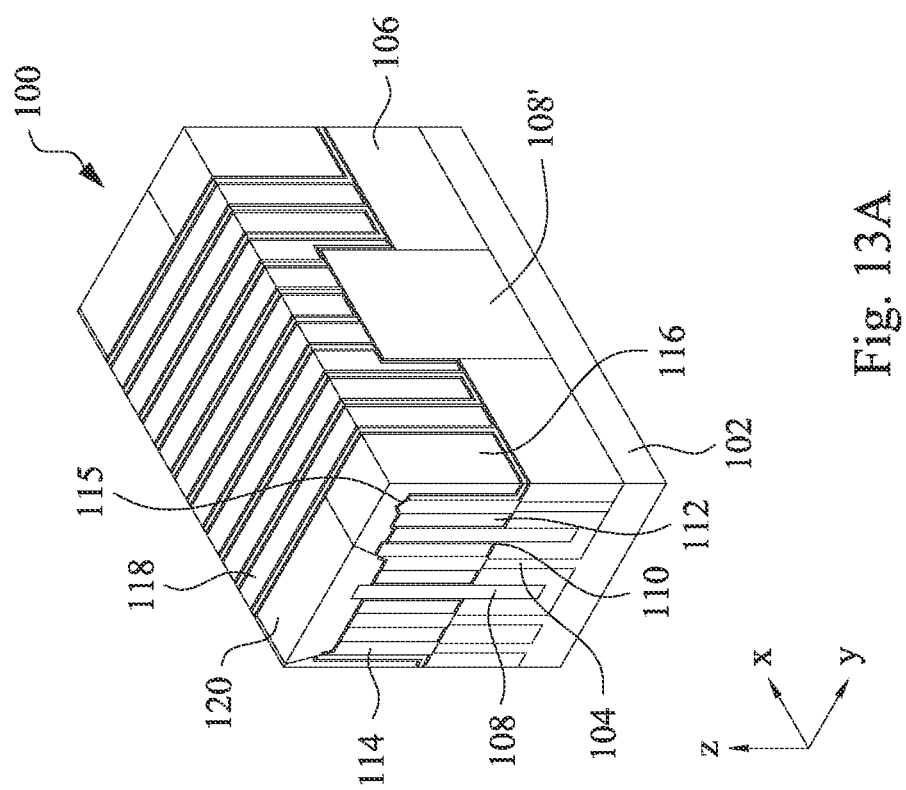

At operation 228, the method 200 (FIG. 2B) forms S/D contacts 120 conductively connecting to some of the epitaxial S/D features 114. An example is illustrated in FIGS. 13A and 13B which correspond to the embodiment of the device 100 shown in FIG. 1B. The other embodiments of the device 100 as shown in FIGS. 1A, 1C, 1D, and 1E can be similarly formed by performing the operations 202-228. The operation 228 may include a variety of processes including photolithography, etching, and deposition. For example, the operation 228 may form an etch mask over the structure 100 using photolithography, etch the ILD layer 116 and the CESL 115 using one or more etching processes to form S/D contact holes that expose the S/D features 114, and deposit the S/D contact 120 into the S/D contact holes. In an embodiment, the operation 228 may form a silicide feature (not shown) between the S/D features 114 and of the S/D contact 120. In some embodiments, when etching the ILD layer 116 and the CESL 115 to form the contact holes, the etchant is tuned not to etch the dielectric fins 108, resulting in the dielectric fins 108 extending into the S/D contact 120 such as shown in FIGS. 1B, 1D, and 13A. In some other embodiments, the etchant is tuned also to slightly etch the dielectric fins 108 and the spacer feature 112, resulting in a substantially flat bottom surface of the S/D contacts 120 as shown in FIGS. 1A, 1C, and 1E. In various embodiments, the etching process is tuned to be selective to the ILD layer 116 and does not (or insignificantly) etch the dielectric fins 108 and the spacer feature 112. As a result, the S/D contact holes do not extend deeply between the epitaxial S/D features 114, unlike some traditional devices. Such S/D contact holes can be easily filled with metal features to form the S/D contacts 120, leaving no cavities underneath the S/D contacts 120. The S/D contacts 120 may include a barrier layer and a metal fill layer over the barrier layer. The barrier layer may include a conductive nitride such as TaN or TiN, and the metal fill layer may include aluminum (Al), tungsten (W), copper (Cu), cobalt (Co), combinations thereof, or other suitable material. Each of the barrier layer and the metal fill layer may be formed by PVD, CVD, plating, or other suitable methods.

At operation 230, the method 200 (FIG. 2B) performs further processes to form a final device. For example, the method 200 may form one or more dielectric layers atop the structure shown in FIG. 1A, 1B, 1C, 1D, 1E, or 13A; form S/D contact plugs and gate contact plugs over the S/D contacts 120 and the gate stacks 118 respectively; and form metal interconnects to connect terminals of various transistors to form an IC.

Although not intended to be limiting, one or more embodiments of the present disclosure provide many benefits to a semiconductor device and a formation process thereof. For example, embodiments of the present disclosure provide methods of forming dielectric fins between semiconductor fins so that the total fins are more evenly distributed. The methods further form spacer features between adjacent fins, and use the dielectric fins and the spacer features to restrict the epitaxial growth of S/D features. The methods can be used for tuning the size of the epitaxial S/D features, for example, for reducing parasitic capacitances thereof. The methods can also be used for preventing cavities underneath S/D contacts. The devices, constructed according to the present disclosure have the benefits of reduced parasitic capacitances and are free of cavities underneath S/D contacts.

In one exemplary aspect, the present disclosure is directed to a semiconductor structure. The semiconductor structure includes a substrate; a first semiconductor fin extending upwardly from the substrate; an isolation structure over the substrate and on sidewalls of the first semiconductor fin; a first epitaxial feature over the first semiconductor fin; a dielectric fin partially embedded in the isolation structure and projecting upwardly above the isolation structure; and first and second spacer features over the isolation structure. The first spacer feature is laterally between the first epitaxial feature and the dielectric fin, and the first epitaxial feature is laterally between the first and second spacer features.

In an embodiment of the semiconductor structure, the first epitaxial feature is in direct contact with both the first and second spacer features. In a further embodiment, the semiconductor structure includes an oxide layer between the first spacer feature and the dielectric fin.

In another embodiment, the semiconductor structure further includes a second semiconductor fin extending upwardly from the substrate and through the isolation structure, wherein the dielectric fin is positioned laterally between the first and second semiconductor fins. In an embodiment, the semiconductor structure further includes a second epitaxial feature over the second semiconductor fin; and third and fourth spacer features over the isolation structure, wherein the third spacer feature is laterally between the second epitaxial feature and the dielectric fin, and the second epitaxial feature is laterally between the third and fourth spacer features.

In yet another embodiment, the semiconductor structure further includes a conductive feature over and in direct contact with the first epitaxial feature, wherein the conductive feature is also disposed over a top surface and sidewall surfaces of the dielectric fin.

In an embodiment of the semiconductor structure, a first width of the first epitaxial feature as measured across top surfaces of the first and second spacer features is greater than a second width of the first epitaxial feature as measured at half-height of the first epitaxial feature.

In another embodiment, the semiconductor structure further includes a gate stack over and engaging the first semiconductor fin and the dielectric fin, wherein a first height of the dielectric fin directly under the gate stack is greater than a second height of the dielectric fin adjacent to but not directly under the gate stack.

In an embodiment of the semiconductor structure, the dielectric fin includes one of silicon carbide nitride, silicon oxycarbide, and silicon oxycarbide nitride; and each of the first and second spacer features includes one of silicon carbide nitride, silicon oxycarbide, and silicon oxycarbide nitride. In another embodiment, the dielectric fin includes a metal oxide.

In another exemplary aspect, the present disclosure is directed to a semiconductor structure. The semiconductor structure includes a substrate; first and second semiconductor fins extending upwardly from the substrate; an isolation structure over the substrate and on sidewalls of the first and second semiconductor fins; first and second epitaxial features over the first and second semiconductor fins respectively; and a dielectric fin partially embedded in the isolation structure and projecting upwardly above the isolation structure. The dielectric fin is between the first and second semiconductor fins. The dielectric fin and the first and second semiconductor fins are arranged lengthwise along a same direction from a top view. The semiconductor structure further includes first and second spacer features over the isolation structure. The first spacer feature is laterally between the first epitaxial feature and the dielectric fin, and the second spacer feature is laterally between the dielectric fin and the second epitaxial feature.

In an embodiment of the semiconductor structure, the dielectric fin includes one of silicon carbide nitride, silicon oxycarbide, silicon oxycarbide nitride, hafnium oxide, and zirconium oxide; and each of the first and second spacer features includes one of silicon carbide nitride, silicon oxycarbide, and silicon oxycarbide nitride.

In an embodiment, the semiconductor structure further includes a conductive feature over and in direct contact with the dielectric fin, the first and second spacer features, and the first and second epitaxial features, wherein the conductive feature wraps around a top portion of the dielectric fin.

In another embodiment, the semiconductor structure further includes third and fourth spacer features over the isolation structure, wherein the first epitaxial feature is in direct contact with the first and third spacer features on both sides of the first epitaxial feature, and the second epitaxial feature is in direct contact with the second and fourth spacer features on both sides of the second epitaxial feature. In yet another embodiment, the semiconductor structure further includes an oxide layer between the dielectric fin and each of the first and second spacer features.

In yet another exemplary aspect, the present disclosure is directed to a method. The method includes providing a structure having a substrate and first and second semiconductor fins above the substrate; and depositing an isolation structure over the substrate and on sidewalls of the first and second semiconductor fins, resulting in a trench between two portions of the isolation structure that are on two opposing sidewalls of the first and second semiconductor fins. The method further includes depositing a dielectric fin in the trench; recessing the isolation structure to fall below top surfaces of the first and second semiconductor fins and the dielectric fin; depositing an oxide layer over at least top and sidewall surfaces of the first and second semiconductor fins; depositing a spacer feature over the oxide layer and filling spaces between the first and second semiconductor fins and the dielectric fin; recessing the first and second semiconductor fins, resulting in two trenches between portions of the spacer feature; and epitaxially growing one or more semiconductor materials in the two trenches.

In an embodiment of the method, the depositing of the isolation structure uses atomic layer deposition (ALD), and the depositing of the oxide layer uses ALD. In another embodiment of the method, the recessing of the first and second semiconductor fins also recesses the portions of the spacer feature that form sidewalls of the two trenches. In a further embodiment, the recessing of the first and second semiconductor fins also recesses the dielectric fin. In yet another embodiment, the method further includes, before the depositing of the spacer feature, forming a gate structure over the oxide layer, wherein the spacer feature is also deposited on sidewalls of the gate structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a dielectric isolation structure disposed on the substrate;
   a semiconductor fin disposed on the substrate and extending through the dielectric isolation structure;
   first and second dielectric fins disposed on the dielectric isolation structure and sandwiching the semiconductor fin;
   a dielectric block disposed on the substrate and interfacing with the first and second dielectric fins; and
   an epitaxial feature over the semiconductor fin, wherein the epitaxial feature has a bottom portion laterally between the first and second dielectric fins.

2. The semiconductor device of claim 1, wherein the dielectric block interfaces with the semiconductor fin.

3. The semiconductor device of claim 1, further comprising:
   a gate stack disposed on the semiconductor fin; and
   a spacer layer over sidewalls of the gate stack, wherein the spacer layer is laterally between the semiconductor fin and each of the first and second dielectric fins.

4. The semiconductor device of claim 3, further comprising:
   an oxide layer disposed on the dielectric isolation structure, wherein the oxide layer is laterally between the spacer layer and each of the first and second dielectric fins.

5. The semiconductor device of claim 1, wherein the epitaxial feature has a top portion above the first and second dielectric fins.

6. The semiconductor device of claim 5, wherein the top portion of the epitaxial feature has a faceted sidewall.

7. The semiconductor device of claim 5, wherein the top portion of the epitaxial feature has a larger width than the bottom portion of the epitaxial feature.

8. The semiconductor device of claim 1, wherein the bottom portion of the epitaxial feature has a vertical sidewall.

9. The semiconductor device of claim 1, wherein the bottom portion of the epitaxial feature has a tapering sidewall.

10. The semiconductor device of claim 1, wherein the first and second dielectric fins have different heights.

11. A semiconductor device, comprising:
    a substrate;
    a dielectric isolation structure disposed on the substrate;
    a semiconductor fin disposed on the substrate and extending through the dielectric isolation structure;
    a dielectric fin disposed on the dielectric isolation structure;
    an epitaxial feature over the semiconductor fin; and
    a spacer feature sandwiched between the epitaxial feature and the dielectric fin, wherein the spacer feature has a tapering sidewall facing the epitaxial feature and a vertical sidewall facing the dielectric fin.

12. The semiconductor device of claim 11, wherein the tapering sidewall of the spacer feature interfaces with the epitaxial feature.

13. The semiconductor device of claim 12, wherein the vertical sidewall of the spacer feature interfaces with the dielectric fin.

14. The semiconductor device of claim 12, wherein the vertical sidewall of the spacer feature is distant from the dielectric fin.

15. The semiconductor device of claim 14, further comprising:
    a dielectric layer sandwiched between the dielectric fin and the vertical sidewall of the spacer feature.

16. The semiconductor device of claim 11, further comprising:
    a conductor disposed on the epitaxial feature,
    wherein a top portion of the dielectric fin protrudes into a bottom portion of the conductor.

17. A semiconductor device, comprising:
    a substrate;
    a dielectric isolation structure disposed on the substrate;
    first and second semiconductor fins disposed on the substrate and extending through the dielectric isolation structure;
    first and second epitaxial features over the first and second semiconductor fins respectively;
    a dielectric fin disposed on the dielectric isolation structure and sandwiched between the first and second epitaxial features; and
    a contact feature interfacing with the dielectric fin and the first and second epitaxial features,
    wherein the dielectric fin is above the first and second epitaxial features.

18. The semiconductor device of claim 17, wherein a bottom portion of the dielectric fin is embedded in the dielectric isolation structure.

19. The semiconductor device of claim 17, wherein the second epitaxial feature is above the first epitaxial feature.

20. The semiconductor device of claim 17, wherein each of the first and second epitaxial features has tapering sidewalls.

* * * * *